United States Patent
Takada et al.

(10) Patent No.: US 6,291,761 B1
(45) Date of Patent: Sep. 18, 2001

(54) SOLAR CELL MODULE, PRODUCTION METHOD AND INSTALLATION METHOD THEREFOR AND PHOTOVOLTAIC POWER GENERATION SYSTEM

(75) Inventors: Takeshi Takada, Kyotanabe; Akiharu Takabayashi, Nara; Masahiro Mori, Kyoto; Ayako Komori, Mishima; Masaaki Matsushita, Kyotanabe, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/471,159

(22) Filed: Dec. 23, 1999

(30) Foreign Application Priority Data

Dec. 28, 1998 (JP) .................................. 10-372453

(51) Int. Cl.$^7$ .................................. H01L 31/042
(52) U.S. Cl. .................. 136/244; 136/245; 136/258; 136/251; 136/256; 136/246; 52/173.3; 60/641.8; 438/64; 438/66
(58) Field of Search .................. 136/244, 245, 136/258 AM, 251, 256, 246; 52/173.3; 60/641.8; 438/64, 66

(56) References Cited

U.S. PATENT DOCUMENTS

| | | | |
|---|---|---|---|
| 5,069,727 | * 12/1991 | Kouzuma et al. | 136/251 |
| 6,061,977 | * 5/2000 | Toyama et al. | 52/173.3 |
| 6,063,996 | * 5/2000 | Takada et al. | 136/246 |

FOREIGN PATENT DOCUMENTS

| | | |
|---|---|---|
| 874404 | * 10/1998 | (EP) . |
| 4-266069 | 9/1992 | (JP) . |
| 6-5769 | 1/1994 | (JP) . |
| 7-302924 | 11/1995 | (JP) . |
| 9-177274 | 7/1997 | (JP) . |
| 11-214724 | * 8/1999 | (JP) . |

OTHER PUBLICATIONS

English translation of JP 4–266069, Sep. 1992.*
K. Nakatani, et al., "Electrical Properties of Hydrogenated Amorphous Silicon Layers on a Polymer film Substrate under Tensile Stress", Appl. Phys. Lett., vol. 54, No. 17, pp. 1678–1680, Apr. 1989.
M. Utsunomiya, et al., "Effect of Mechanical Strain on Electrical Characteristics of Hydrogenated Amorphous Silicon Junctions", J. Appl. Phys., vol. 66, No. 1, pp. 308–311, Jul. 1989.

* cited by examiner

Primary Examiner—Alan Diamond
(74) Attorney, Agent, or Firm—Fitzpatrick, Cella, Harper & Scinto

(57) ABSTRACT

A solar cell module comprises a front surface member disposed on a front surface side of a photovoltaic element having at least a semiconductor photoactive layer on a flexible substrate, a back surface member disposed on a back surface side of the photovoltaic element, and a sealing material interposed therebetween. The flexible substrate of the photovoltaic element has a plurality of substantially parallel surface grooves on a surface thereof at the semiconductor photoactive layer side of the flexible substrate. At least one portion of the solar cell module is processed to deform in such a direction that strain generated in a substantially parallel direction to the surface grooves is applied to the photovoltaic element. In this way, a solar cell module can be subjected to deformation-processing that prevents, to the extent possible, cracks in the semiconductor photoactive layer of the photovoltaic elements; in other words, deformation-processing can be achieved without influencing electrical characteristics. A method of producing such a solar cell module is also disclosed.

28 Claims, 12 Drawing Sheets

NEGATIVE ELECTRODE SIDE

POSITIVE ELECTRODE SIDE

US 6,291,761 B1

SOLAR CELL MODULE, PRODUCTION METHOD AND INSTALLATION METHOD THEREFOR AND PHOTOVOLTAIC POWER GENERATION SYSTEM

BACKGROUND OF THE INVENTION

1. Field of the Invention

The present invention relates to a solar cell module which is highly reliable at a low cost, as well as to a production method and an installation method therefor, and a photovoltaic power generation system. In particular, the present invention relates to a roof material-integrated type solar cell module which has undergone transformation processing so as not to influence its electrical characteristics and which can be excellently designed, and a production method therefor.

2. Related Background Art

In the midst of increasing global environmental problems in recent years, solar photovoltaic energy has become keenly noted as clean energy which does not produce harmful by-products such as those produced in connection with thermal power and nuclear power, etc. In addition, given the limited resources on the earth, efficient use of solar energy which is an unlimited energy source is highly desired.

In addition, a centralized energy system such as with thermal power or nuclear power presents problems such that energy supply might be disturbed or might take an enormous time for recovery when a disaster such as an earthquake takes place. Solar energy can be utilized wherever and whenever it is sunny, and therefore has a high utility value as a dispersion type independent energy source.

These needs have promoted a development of a solar cell module which can be used on house roofs, and today regulatory systems for installation of photovoltaic power generation systems and operation thereof have been prepared.

The photovoltaic power generation system requires, as a power source thereof, a solar cell array composed of a plurality of connected solar cell modules. As the system for a general houses, a photovoltaic power generation system of 3 kw is standard, and in this case, almost all portions of the roof plane facing south are occupied with solar cell arrays.

The structures of disposing solar cell arrays on the roof of a house are roughly divided into two kinds, namely, the frame-installation type structure and the roof material-integrated type structure. Each of them is described as follows.

The frame-installation type structure comprises a frame and solar cell panels, wherein the frame is disposed on the roof and the solar panels are arranged thereon. Therefore, there is an advantage that solar cell arrays can be disposed on an existing roof. However, the weight of the entire roof will be heavy, and earthquake proofness is reduced; in addition, the cost for installing the frames and the solar cell panels increases.

The roof material-integrated type structure is composed of a roof material-integrated type solar cell module. The roof material-integrated type solar cell module is superior in compatibility with normal roofs since solar cells are integrated with a conventional roof material to form a module. For example, also as for installation, the same construction method as that for conventional roof material can be employed, and in addition, furnishings such as clips, etc. which are necessary to fix roof materials can be used. In addition, since the roof material-integrated type structure does not require frames and since solar cell arrays can be obtained only by roofing, the costs for installation are low. Furthermore, the roof weight is far lighter and more excellent in earthquake proofness than that in the frame-installation type structure. In addition, integration with the roof materials is harmonized with the roof design, which is an excellent advantage from the aesthetic point of-view.

As described above, the roof material-integrated type solar cell module provides many advantages, and the present inventors are proceeding with research and development so as to attain its practical use.

In Japanese Patent Application Laid-Open No. 7-302924, a roof material-integrated type solar cell module is described. For the roof material-integrated type solar cell module, in terms of its production method, a plane-shaped solar cell module can be processed with a roller former molding apparatus for conventional roof materials, and thus no further equipment investments are required and its production can be implemented at a low cost. This solar cell module described in Japanese Patent Application Laid-Open No. 7-302924 is formed by insulation-sealing a flexible amorphous silicon semiconductor with a resin on a steel plate conventionally used as the roof material, in order to have a structure which can be processed in the same manner as the processing of roof materials. The roof material is designed so that roof materials for horizontal roofing is employed, and the photovoltaic elements are disposed in a flat portion. It therefore has a structure that the photovoltaic elements is subjected to strain.

The roof material-integrated type solar cell module described above will be described with reference to attached drawings. FIGS. 10A and 10B are a perspective view and a sectional view of a representative roof material-integrated type solar cell module, respectively. FIGS. 10A and 10B show a front surface member 1001, a sealing material 1002, a photovoltaic element or a photovoltaic element group 1003, a back surface insulating material 1004 and a back surface member 1005.

More specifically, the front surface member 1001 is, for example, ETFE (ethylene-tetrafluoroethylene copolymer) film, and the sealing material 1002 is, for example, EVA (ethylene-vinyl acetate copolymer). The sealing material 1002 at the light-receiving surface side is impregnated with a surface protection reinforcement (not shown in the drawings) to prevent external scratches. As the surface protection reinforcement, in particular, for example, glass nonwoven fabric is used. The photovoltaic element 1003 is, for example, an amorphous silicon semiconductor element, and in addition, the back surface insulating material 1004 is, for example, a PET (polyester) film. As the back surface member 1005, for example, a zinc-coated steel plate is used.

Each of the structural materials is a material having a property to be easily processed and therefore is processed to form a suitable shape as the roof material by plastic deformation of a zinc-coated steel plate as the back surface member. Photovoltaic element portions also can be processed and are made to remain flat taking the design of roof materials for horizontal roofing into consideration.

However, recently, individual originality tends to be deemed important, and this trend is not an exception for building materials and solar cell modules. For the purpose of producing solar cells or building materials in various shapes, as described in Japanese Patent Application Laid-Open No. 7-302924, it is necessary for such a solar cell module to be processed over all regions including its photovoltaic elements, thereby making it possible to design without always keeping surfaces of photovoltaic elements flat.

As an example corresponding to this, a solar cell module in a wave shape is described in Japanese Patent Publication No. 6-5769. The main purpose of adopting a wave shape is to increase efficiency for light utilization. The production method includes procedures of first producing a solar cell module having flexibility and next bonding it onto a wave-shaped steel plate with an adhesive.

However, in the wave-shaped solar cell module described in Japanese Patent Publication No. 6-5769, photovoltaic elements are arranged in wave shapes, but no consideration has been paid to concrete stress to be put onto the photovoltaic elements as well as the influence on the electrical characteristics thereof, and the reliability thereof. Furthermore, according to the production method of the above wave-shaped solar cell module, a conventional roof-material molding machine can not be used for processing and the cost reduction expected for roof material-integrated type solar cell modules has not been achieved.

On the other hand, characteristics in the case where an amorphous silicon semiconductor is deformed have been reported. For example, in Appl. Phys. Lett. 54(17), 1989, p. 1678–1680, "Electrical Properties of Hydrogenated Amorphous Silicon Layer on Polymer Film Substrate under Tensile Stress", changes in resistance of amorphous silicon layer in a dark state in the case where a single layer of amorphous silicon (0.5 $\mu$m thick, and mainly composed of i-type amorphous silicon) is stacked on a PET substrate (100 $\mu$m thick), and then the amorphous silicon layer is tensed. Details of this report are as follows: "When an amorphous silicon layer is pulled, its resistance raises gradually up to 7000 u$\epsilon$ due to the piezo effect (in a reversible fashion), and from 7000 p$\epsilon$, the resistance raises suddenly due to cutting of weak Si—Si bonding (in irreversible fashion). However, the amorphous silicon layer in which resistance has been raised due to strain not less than 7000 u$\epsilon$ returns to the original shape by annealing in 150° C. for one hour."

In addition, in J. Appl. Phys. 66 (1), 1989, p. 308–311, "Effect of Mechanical Strain on Electrical Characteristics of Hydrogenated Amorphous Silicon Junction", the piezo effect of amorphous silicon having a pin junction has been reported. Contents of this report are as follows: "In amorphous silicon having pin junction, when it is subjected to strain in a parallel direction to the pin junction, electric current is decreased by eight percent in both a forward direction and a backward direction under compression stress of 7500 $\mu\epsilon$ (in a dark state). In addition, electric current is increased by eight percent under compression stress of 7500 $\mu\epsilon$."

However, in any of those reports, no descriptions on a case where strained photovoltaic elements are used, nor descriptions on a processing method thereof and moreover reliability thereof have been made.

In addition, Japanese Patent Application Laid-Open No. 9-177274 discloses in particular a method of bending a flexible photovoltaic element. By providing a bending-controlling member on collector electrodes so that the collector electrodes do not bend in a parallel direction to the longitudinal direction of the collector electrodes, the phenomenon that highly stiff collector electrodes become unable to follow a bent surface and are peeled off from the transparent electrode layer is prevented.

However, the above application relates only to preventing highly stiff collector electrodes from being peeled off from the transparent electrode layer, but there is no description with regard to a state of a semiconductor photoactive layer or a transparent electrode layer at the time when the electrodes have been bent. In addition, in an actual case of processing of photovoltaic elements, the element may not be bent but stretched flatly, and reliability in deformation of photovoltaic elements and influence of the semiconductor photoactive layer or the transparent electrode layers due to bending have not been considered.

In addition, Japanese Patent Application Laid-Open No. 4-266069 discloses a concrete method of bending a flexible photovoltaic element. A reliable solar cell module without giving rise to deterioration in electrical characteristics is obtained by processing a photovoltaic element having a predetermined concaveconvex surface with elongating deformation of not more than six percent.

As described above, there are conventional examples of a solar cell module in which photovoltaic elements are subjected to strain, but descriptions with regard to a method of processing or with regard to reliability on photovoltaic elements subjected to strain are scarce. As a result of this, it is a fact that a low-cost roof material-integrated type solar cell module which can be obtained by simply processing a flat plate solar cell module with a molding machine has not yet been successfully put into practical use.

Under the circumstances, the present inventors have developed a solar cell module in which the photovoltaic element portion is processed. The goal therein is to obtain a solar cell module which can be processed and deformed using a conventional roof-material molding machine in any region regardless of the location of the photovoltaic elements, that is, in a free region, thereby providing a highly-designed roof material-integrated type solar cell module at a low cost.

To realize the above-described goal, it is indispensable to secure reliability in the solar cell module in the case where a flat plate solar cell module is processed, but the reliability largely depends on the strain generated at the time when the solar cell module is processed.

Among strains, a significant strain in the present invention refers to the strain related to the photovoltaic element inside the solar cell module. The strain in the photovoltaic element influences the electrical characteristics as well as reliability of the solar cell module, for example, if it is flat in outward appearance without any problems on its surface.

In Japanese Patent Application Laid-Open No. 4-266069, the relationship between a concave-convex shape and electrical characteristics of photovoltaic elements due to strain is described, but moreover in the present invention, the goal has been set to clarify the relationship between the direction of the convex-concave shape and the direction of strain, and to secure higher reliability in the processed photovoltaic elements.

FIGS. 11A and 11B are respectively a plan view and a sectional view of a representative photovoltaic element.

This photovoltaic element 1106 is composed of a semiconductor photoactive layer 1102 and a transparent conductive layer 1103 formed on a flexible substrate 1101 in this order, and further collector electrodes 1104 and a busbar electrode 1105 formed on the transparent electrode layer 1103.

When the photovoltaic element 1106 receives light, electricity is generated from the semiconductor photoactive layer 1102 with the flexible substrate 1101 and the transparent electrode layer 1103 being the poles. In that case, the flexible substrate 1101 is a conductive substrate. At the side of the transparent electrode layer 1103, electricity is collected by the collector electrode 1104, and then concentratedly flows into the busbar electrode 1105 for taking out electricity outside. The side of transparent electrode layer 1103 is formed so as to reduce the shadowed area as much as possible by miniaturizing the collector electrodes 1104 and the busbar electrode 1105 and the like for the purpose of introducing much light into the semiconductor photoactive layer 1102.

Reliability in the case where strain is added to a representative photovoltaic element as mentioned above will be described.

In this case, the photovoltaic element is deformed to have a curved surface, or it remains flat. But in any case, each constituent member is stretched and deformed by strain applied in the stretching direction. When strain is small with a value not more than the critical value at which cracking is caused for each constituent member, each constituent member is stretched and can follow deformation. However, when strain becomes larger, each constituent member is deformed in excess of the critical value at which cracking is caused, thereby generating cracks.

The flexible substrate having flexibility can follow deformation even when strain is applied to a certain extent, but the semiconductor photoactive layer as well as the transparent electrode layer have a comparatively small critical value at which cracking is caused, and therefore when strain larger than the critical value is applied, cracking occurs. The cracks generated in the transparent electrode layer are not significantly influential, but in the case where cracking takes place in the semiconductor photoactive layer, a conductive material intrudes into the crack thereby generating a short circuit between the flexible substrate of the photovoltaic element and the transparent electrode layer and deteriorating the electrical characteristics of the photovoltaic elements. For example, as the electricity collecting electrode, in general, highly conductive materials are used, and thus when cracks are generated under the collector electrode, a short circuit is highly possible.

Next, F. F. (fill factor) which is a factor representing electrical characteristics of the photovoltaic elements will be described.

F. F. is represented by the equation: F. F.=maximum power Pm/(short-circuit current Isc×opening voltage Voc). That is, as a meaning in terms of physics, the F. F. is a value showing a ratio of the maximum power Pm which can be actually taken out to the product of Voc as a value in the case of taking out only a voltage to the maximum extent and Isc as a value in the case of taking out only a current to the maximum extent. The actual value of F. F. is determined by the characteristics of the p-n junction in the forward direction. Thus, when any leakage current flows through defects included in the photoactive layer to be used or a defect generated at the time of p-n junction production or in the succeeding manufacturing steps, the F. F. decreases to reduce the output to be generated originally. That is, when cracks generated in the semiconductor photoactive layer increase, the F. F. decreases.

Thus, reliability of the photovoltaic element subjected to strain greatly depends on the cracks generated in the semiconductor photoactive layer.

SUMMARY OF THE INVENTION

An object of the present invention is to provide a solar cell module which is subjected to deformation-processing in such a manner as to minimize cracks generated in the semiconductor photoactive layer of the photovoltaic elements, that is, deformation-processing without influencing electrical characteristics, as well as to provide a production method therefor in order to realize improvement in reliability of the solar cell module.

In order to achieve the above object, the present invention has been constituted as follows.

The solar cell module of the present invention comprises a front surface member disposed on a front surface side of a photovoltaic element having at least a semiconductor photoactive layer on a flexible substrate, a back surface member disposed on a back surface side of the photovoltaic element, and a sealing material interposed therebetween, wherein the flexible substrate of the photovoltaic element has a plurality of substantially parallel surface grooves formed on the surface thereof at the side of the semiconductor photoactive layer, and at least one portion of the solar cell module is processed to deform in such a direction so that strain generated in a substantially parallel direction to the surface grooves is applied to the photovoltaic element.

In addition, a method of producing a solar cell module according to the present invention comprises disposing a front surface member on a front surface side of a photovoltaic element having at least a semiconductor photoactive layer on a flexible substrate, disposing a back surface member on a back surface side of the photovoltaic element, and interposing a sealing material therebetween, wherein the method further comprises a step of generating a plurality of substantially parallel surface grooves on the surface of the flexible substrate at the semiconductor photoactive layer side, and a step of processing at least one portion of the solar cell module to deform in such a direction so that strain generated in a substantially parallel direction to the surface grooves is applied to the photovoltaic element.

In the present invention, the solar cell module is deformed in such a direction that strain is applied in a substantially parallel direction to the surface grooves. Therefore, as compared with the case where strain is applied in a perpendicular direction, the surface grooves reduce the local concentration of strain in the flexible substrate of the photovoltaic element within the solar cell module, and consequently reduces the generation of cracks in the semiconductor photoactive layer.

The effect of the present invention can be further increased by adopting the following modes.

The strain is a strain in a stretching direction.

The strain has a value not less than the critical value where cracking occurs in the semiconductor photoactive layer of the photovoltaic element.

The flexible substrate is a conductive substrate.

The conductive substrate is made of stainless steel.

The surface grooves are generated during the rolling step in the step of producing the flexible substrate.

The rolling step is a cold rolling step.

The semiconductor photoactive layer is an amorphous silicon-based semiconductor.

The back surface member is made of a metal plate.

The front surface member is made of a transparent resin film.

The sealing material is made of an organic polymer resin.

The photovoltaic element has an insulating material on its back surface side, and the insulating material consists of a transparent resin film.

The solar cell module is a building material-integrated solar cell module. Specifically, the solar cell module is processed to bend into the shape of the building material by deformation-processing, thereby completing the building material-integrated solar cell module.

The method of the present invention of installing the solar cell module comprises fixing the solar cell module on an installation surface by utilizing a fixing member.

The photovoltaic power generation system of the present invention comprises the solar cell module and a power conversion device connected to the solar cell module.

BRIEF DESCRIPTION OF THE DRAWINGS

FIG. 1A is a perspective view, and

FIG. 1B is a sectional view taken along a line 1B—1B of FIG. 1A.

FIG. 2A is a perspective view, and

FIG. 2B is a sectional view taken along a line 2B—2B of FIG. 2A.

FIG. 3A is a plan view,

FIG. 3B is a sectional view taken along a line 3B—3B of FIG. 3A, and

FIG. 3C is a sectional view taken along a line 3C—3C of FIG. 3A.

FIG. 4A is a plan view,

FIG. 4B is a partially enlarged view of the portion surrounded by a circle of FIG. 4A, and FIG. 4C is a sectional view taken along a line 4C—4C of FIG. 4B.

FIG. 5A is a plan view of the photovoltaic element group when FIGS. 4A, 4B and 4C are seen from the back surface side, and FIG. 5B is a sectional view taken along a line 5B—5B of FIG. 5A.

FIG. 6A is a plan view, and

FIG. 6B is a sectional view taken along a line 6B—6B of FIG. 6A.

FIG. 7A is a plan view, and

FIG. 7B is a sectional view taken along a line 7B—7B of FIG. 7A.

FIG. 8A is a perspective view, and

FIG. 8B is a sectional view taken along a line 8B—8B of FIG. 8A.

FIG. 9A is a perspective view, and

FIG. 9B is a sectional view taken along a line 9B—9B of FIG. 9A.

FIG. 10A is a perspective view, and

FIG. 10B is a sectional view taken along a line 10B—10B of FIG. 10A.

FIG. 11A is a plan view, and

FIG. 11B is a sectional view taken along a line 11B—11B of FIG. 11A.

FIG. 12A is a plan view of the photovoltaic element, and

FIG. 12B is a sectional view obtained by cutting the element in a perpendicular direction to the surface grooves of the flexible substrate, that is, taken along a line 12B—12B of FIG. 12A.

DETAILED DESCRIPTION OF THE PREFERRED EMBODIMENTS

Operation obtainable with the above-described constitution will be described as follows.

According to the present invention, a solar cell module comprises a photovoltaic element having at least a flexible substrate, the flexible substrate has a plurality of substantially parallel surface grooves on a surface thereof at the side of the photovoltaic element, and at least one portion of the photovoltaic element has strain generated in the substantially parallel direction to the surface grooves by processing. Therefore, local concentration of strain is reduced by the surface grooves of the flexible substrate of the photovoltaic element, and as a result, the generation of cracks in the semiconductor photoactive layer is reduced.

Further detailed description will be made with reference to the attached drawings.

Figure 12A:
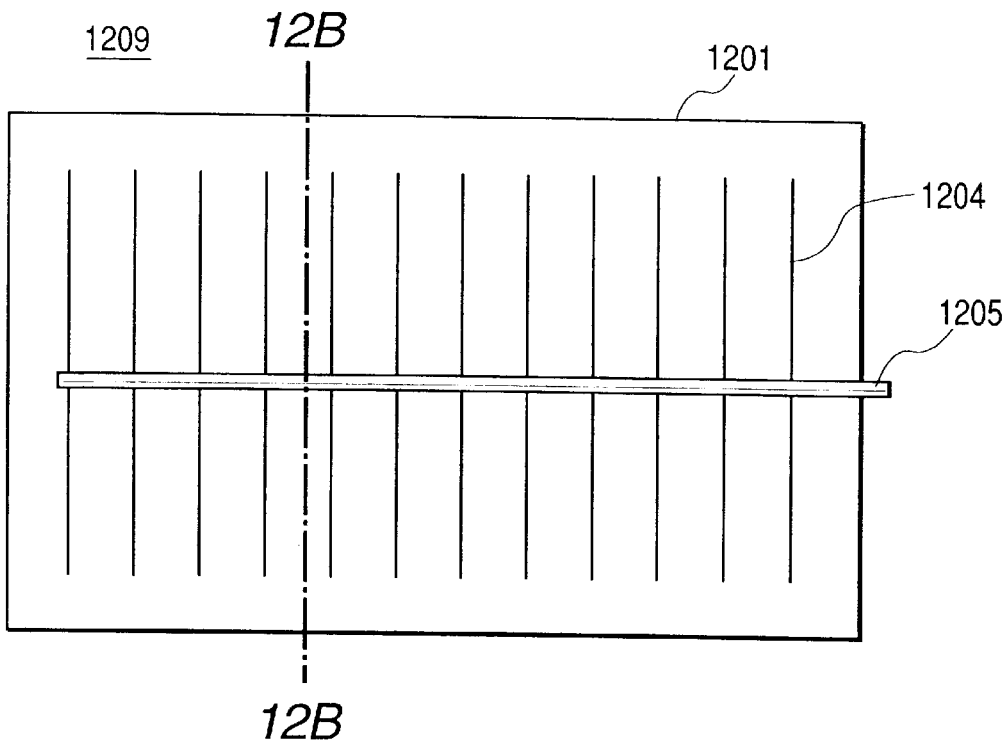
FIGS. 12A and 12B are conceptual views showing surface grooves of a flexible substrate and a photovoltaic element in which tensile strain is applied in a substantially perpendicular direction to these grooves.
Figure 12B:
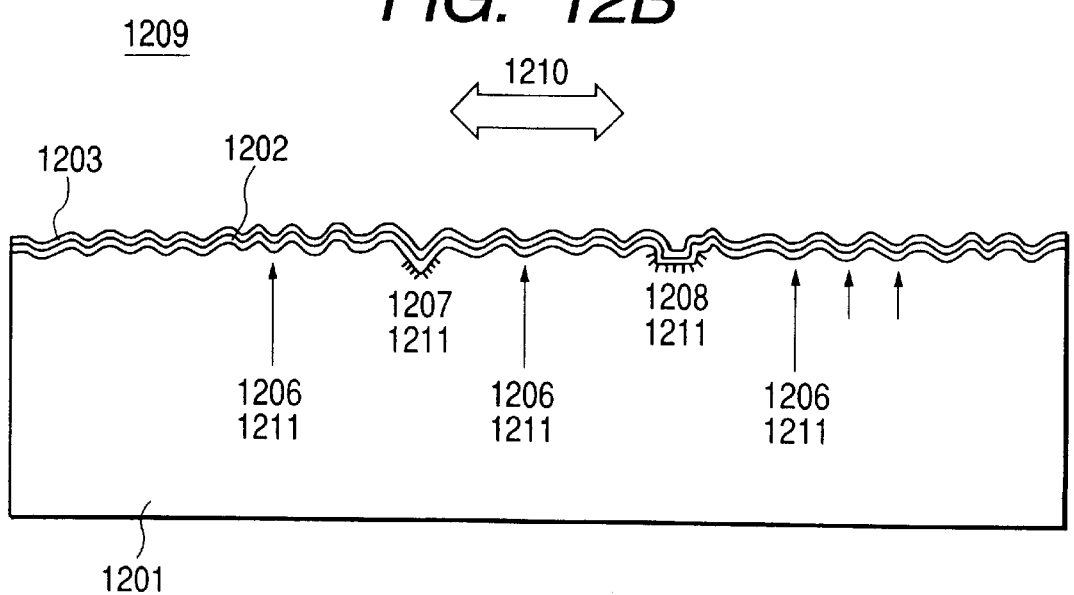

FIG. 12A is a plan view of a representative photovoltaic element, and FIG. 12B is a sectional view obtained by cutting the element in a perpendicular direction to the surface grooves of the flexible substrate, that is, taken along a line 12B—12B of FIG. 12A. In the photovoltaic element 1209 shown in FIGS. 12A and 12B, the flexible substrate is numbered as 1201, a conductive photoactive layer as 1202, a transparent electrode layer as 1203, a collector electrode as 1204, and a busbar electrode as 1205.

The flexible substrate 1201 is rolled so as to form a thin film during the step of producing the flexible substrate itself. The rolling can give rise to the surface grooves 1206 in a parallel direction to the rolling direction on the flexible substrate 1201. The surface grooves 1206 are generated in the same direction on both the front and back surfaces of the flexible substrate 1201.

Material for the above-described flexible substrate 1201 is, for example, stainless steel, and in general, steel plates such as stainless steel are subjected to cold rolling to obtain a final desired thickness. However, depending on conditions at the time of rolling, there occurs variation in depth of the surface grooves 1206, and as an abnormal phenomena, there occur scratches 1207 due to contact with a rolling roller or craters 1208 due to application of pressure by a rolling oil.

These scratches 1207 and craters 1208 tend to propagate in the rolling direction of the substrate, since the flexible substrate 1201 travels in the rolling direction. That is, the scratches 1207 and the craters 1208 occur in elongated shapes in a parallel direction to the surface grooves 1206.

In the photovoltaic element 1209 comprising the above flexible substrate; if tensile strain is applied in a substantially perpendicular direction 1210, as shown by an arrow in FIG. 12B, to the surface grooves 1206 of the flexible substrate 1201, strain is concentrated on a portion where the total film thickness of the photovoltaic element 1209 is small, and large strain is applied to the concave portions 1211 of the surface grooves 1206. Especially, in the case where scratches 1207 and craters 1208 exist, strain is concentrated on scratches 1207 and craters 1208 in which total film thickness is further reduced. The strain concentrated on a local portion easily exceeds the cracking occurrence critical value of the semiconductor photoactive layer, thereby generating cracks.

However, as in the photovoltaic element 1209 of the present invention, in the case where tensile strain is applied in a substantially parallel direction to the surface grooves 1206 of the flexible substrate 1201 of the element, strain concentration hardly takes place since concavity and convexity of the surface grooves 1206 are small in a direction of strain. In addition, the scratches 1207 and the craters 1208 are also elongated in a direction of strain, whereby strain concentration hardly takes place thereon as well.

Thus, as in the present invention, the photovoltaic element can be subjected to deformation-processing with minimized cracking when tensile strain is applied in a direction of the surface grooves of the flexible substrate of the element.

Moreover, the following features may be added to the basic constitution of the present invention to enhance its effect.

When the above-mentioned strain is a strain in a stretching direction, in the case of tensile strain, cracks occur and influence reliability of the photovoltaic element. Particularly in this case, the present invention is very effective.

In the case where the strain is set at the critical value or more of generating cracks in the semiconductor photoactive layer, the constitution of the present invention can make it possible to reduce the number of cracks. That is, according to the present invention, it is possible to relax limitation due to strain at the time when the photovoltaic element is processed and to process a solar cell module with a high degree of freedom. This can serve to provide a highly designed roof material-integrated type solar cell module.

By using a conductive substrate as the flexible substrate, it is possible to treat it as an electrode of the photovoltaic element, and it is easy to take out electrodes.

By using a conductive substrate composed of a stainless steel, the substrate can have an anti-corrosion property, and also in the case of coating the substrate with a polymer resin, there is no corrosion and oxidization of the substrate, whereby a highly reliable solar cell module can be obtained.

The present invention is effective in the case where scratches or craters occur in the rolling step in the step of producing the flexible substrate.

Especially in the case where the rolling step is a cold rolling, the scratches and the craters are apt to occur. In such a case, the effect of the present invention is remarkably exhibited.

By using a semiconductor photoactive layer composed of amorphous silicon-based semiconductor, the flexibility of the substrate further increases, whereby it is possible to produce a solar cell module having a further increased processing property.

By using the back surface member composed of a metal, the solar cell module has excellent weathering and durability properties.

Compared with the case of using, for example, a glass for coating, by using a front surface member composed of a transparent resin film, it is possible to produce an enormously light-weight solar cell module. Therefore, when it is used as a roof material, earthquake proofness of a house is improved. In addition, use of the film serves to make the solar cell module flexible, thereby improving design freedom and processing properties thereof.

By using the sealing material composed of an organic polymer resin, it is possible to produce a flexible solar cell module utilizing the flexibility of a photovoltaic element to a great extent.

The back surface insulating material is disposed on the back surface side of the photovoltaic element, and thus the back surface insulating material functions to insulate between the photovoltaic element and the back surface member. In addition, the solar cell module is produced by normally making the back surface insulating material a little larger than the photovoltaic element. Therefore, when the solar cell module is looked at from the light-receiving side, the material is disposed so as to overhang the periphery of the photovoltaic element. It is made transparent (for example, transparent resin film) to exhibit an effect of not detracting from the appearance of a solar cell module.

Compared with a frame-installation type structure, wherein a solar cell module is disposed on a conventional building material, use of a building material-integrated type solar cell module makes it possible to provide a solar cell module at a low cost since building materials are unnecessary. Moreover, since the entire roof can be lightened, earthquake proofness of a house is enhanced.

In addition, the solar cell module of the present invention, which is abundant in flexibility, can be processed likewise with a conventional processing molding machine for roof material, thereby resulting in a low production cost. In addition, the processed solar cell module is highly reliable and can be utilized for a long term as the building material-integrated type solar cell module.

Adopting the installation method for a solar cell module in which the solar cell module is fixed on the installation surface with fixing members, the solar cell module can take on various designs and molded shapes, and the module becomes highly valuable for use not only as building material-integrated type but also as frame-installation type and can be installed in various embodiments.

The solar cell module of the present invention can be connected to a power conversion device to produce a photovoltaic power generation system and therefore provide a photovoltaic power generation system at a low cost which has high reliability and especially high design freedom.

Embodiments of the solar cell module of the present invention will be described as follows with reference to drawings. Incidentally, the present invention will not be limited to those embodiments.

Figure 1A:
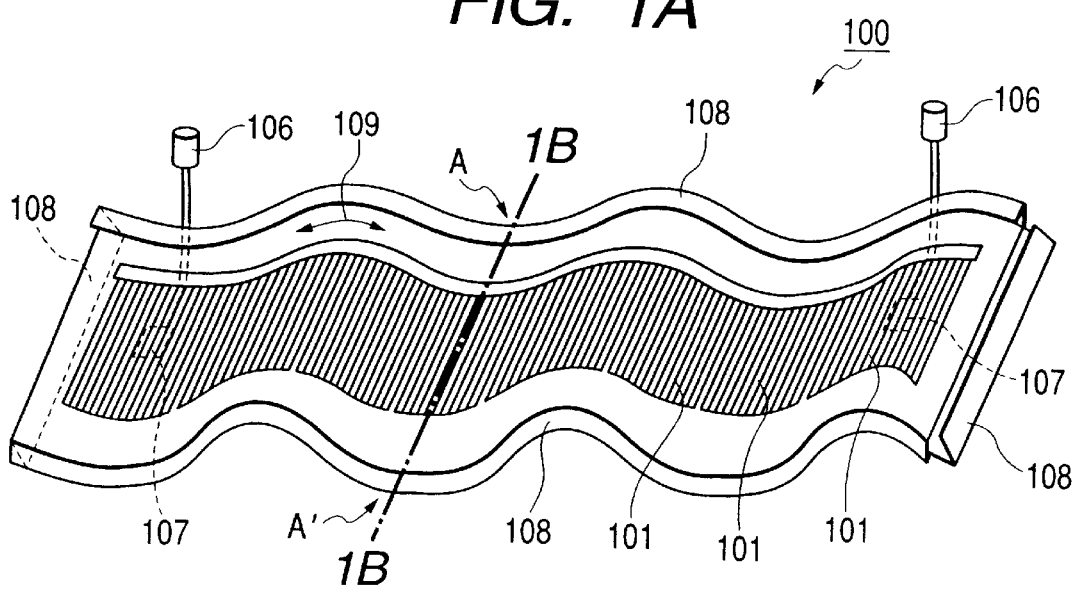
FIGS. 1A and 1B show a roof material-integrated type solar cell module according to the embodiment of the present invention.
Figure 1B:
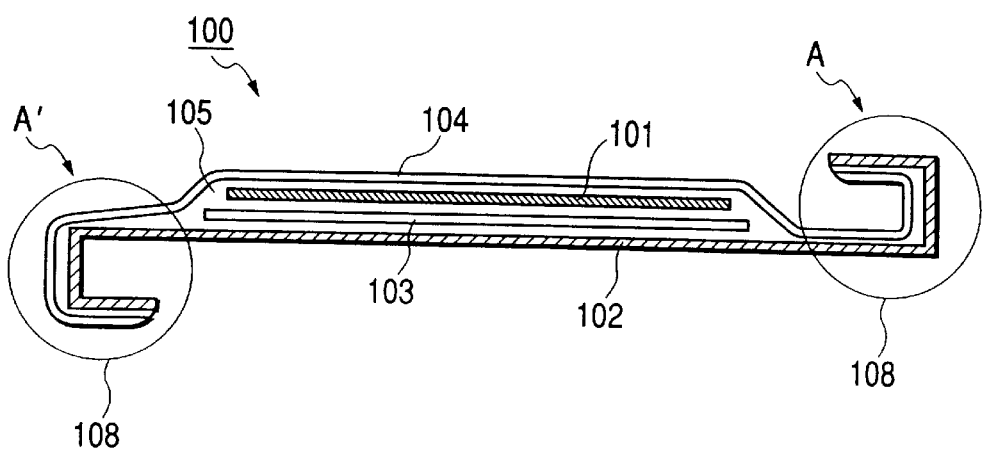

FIGS. 1A and 1B show a wave-shaped type roof material-integrated type solar cell module 100 according to an embodiment of the present invention. FIG. 1A is a perspective view, and FIG. 1B is a sectional view taken along a line 1B—1B of FIG. 1A.

This roof material-integrated type solar cell module 100 has a structure as shown in FIG. 1B in which a photovoltaic element 101 is provided above a back surface member 102 and insulated by a back surface insulating material 103 and a front surface member 104, and each gap between respective materials are bonded with a sealing material 105.

As shown in FIGS. 12A and 12B, each photovoltaic element 101 has at least a semiconductor photoactive layer 1202 sandwiched by a flexible substrate 1201 and a transparent electrode layer 1203. At the back surface side of the photovoltaic element 101, as shown in FIG. 1B, the insulating material 103 composed of a transparent resin film and a back surface member 102 composed of a metal plate for functioning as the roof material are disposed. In addition, at the front surface side of the photovoltaic element, a front surface member 104 composed of a transparent resin film is disposed. A sealing material 105 composed of an organic polymer resin is inserted between them to produce a solar cell module 100.

Electricity generated in the photovoltaic element 101 is, as shown in FIG. 1A, taken outside the solar cell module via an electric wire 106. To the portion where the electric wire is attached, a terminal box 107 is provided for the purpose of insulation protection and waterproofing. In addition, in order to provide a function as a roof material, engagement portions 108 are formed in the periphery.

In the above-described constitution, the solar cell module 100 inclusive of the portion of the photovoltaic element 101 is processed to deform into a wavy shape from a plate shape in order to increase design freedom.

Each engaging portion 108, as well as the molding-process method, is not limited to a particular one, but the plane solar cell module is preferably deformed with conventionally used processing molding machines such as a roll former machine, a press machine, and a vender machine, etc.

In order to improve design freedom, a processing shape is not limited to a particular one, and the solar cell module can be processed to deform into any shape such as a wedge-shape, a stair-shape, a Venetian-shape, and a folded shape, etc., other than a wavy shape. But, in any case, at least one portion of the photovoltaic element 101 has tensile strain 109, and the tensile strain 109 is directed in a substantially parallel direction to the surface grooves 1206 (see FIG. 12) of the flexible substrate 1201 (see FIG. 12) which is a constituent component of the photovoltaic element 101. This direction is a direction to be displaced with about 90 degrees from the direction of the tensile strain 1210 in FIG. 12.

The above-described solar cell module 100 is fixed on the installation surface with a fixing member.

Respective constituent members and terms will be described as follows.

Strain

Strain referred in the present invention has a value expressed by a quantity of variation at the time when a substance is deformed. It particularly refers to the strain generated in the photovoltaic element at the time when the photovoltaic element is subjected to deformation-processing. For example, the strain E in the case where an object having a length L is elongated by ΔL is expressed as follows.

$$\epsilon = \Delta L/L$$

The unit of the strain is expressed by % or $\mu\epsilon$, and normally elongation of 1$ is expressed as 10000 $\mu\epsilon$.

Crack Generating Critical Value

A crack, as referred to in the present invention, means a crack generated at the time when a substance is deformed in such a manner as to exceed the tolerance range of deformation. The crack generating critical value is the critical strain value at which the crack occurs, and naturally depends on materials.

Building Material-Integrated Type Solar Cell Module

A building material-integrated type solar cell module means a building material comprising a photovoltaic element. As a representative, there is a roof material-integrated type solar cell module in which the photovoltaic elements are integrally formed into the light-receiving surface side of the roof material or appearance portion of the roof. Naturally, the roof material-integrated type solar cell module has a function as a roof material, and its design will be the design of a roof.

Engaging Portion

The engaging portion is to be provided at the end of the roof material in order to junction adjacent roof materials together, taking rain-sheltering, resistance against wind damage, load-withstanding property, and installation ease into consideration. For example, in the case of the roof materials for horizontal roofing, as shown in FIG. 1B, junction between roofing materials in a water-flowing direction is implemented by a grooved type downward bent-shaped engaging portion 108 (see A' side of FIG. 1B) molded at the eaves side of the roof materials and by a grooved type upward bent-shaped engaging portion 108 (see A side of FIG. 1B) molded at the ridge side, and they implement a junction. In addition, as concerns junction in a direction perpendicular to the water-flowing direction, the side ends of the roof materials undergo, in the same way, folding to mold the engaging portion 108 as shown in FIG. 1A so that they can undergo junction. In addition, in some cases members for junction are separately prepared to implement junction.

Photovoltaic Element

The photovoltaic element is not limited to a particular one. For example, a single-crystal silicon photovoltaic element, a non-single-crystal photovoltaic element, or more specifically a polycrystal silicon photovoltaic element, an amorphous silicon photovoltaic element, a microcrystal silicon photovoltaic element, a copper indium selenite photovoltaic element, and a compound semiconductor photovoltaic element may be used, but an amorphous silicon-based photovoltaic element in which an amorphous silicon-based semiconductor layer is formed on a flexible stainless steel substrate is suitably used. The photovoltaic element 101 of the present embodiment is an amorphous silicon-based photovoltaic element. But, in any case, at least one portion of the photovoltaic element 101 has a tensile strain 109 generated by deformation-processing, and the strain is directed in a substantially parallel direction to the surface grooves 1206 (see FIGS. 12A and 12B) of the flexible substrate 1201 (see FIGS. 12A and 12B) of the photovoltaic element 101. Here, the term "substantially parallel" means the case where the angle between the direction of strain and the surface grooves falls within a range of 15°, and more preferably within a range of 5°, and further preferably within a range of 1°.

Surface Groove

The surface groove of the present invention refers to a substantially parallel line-shaped concavity and convexity existing on the light-receiving surface side of the flexible substrate 1201 (see FIGS. 12A and 12B) of the photovoltaic element 101, that is, on the side of film formation of the semiconductor photoactive layer 1202 (see FIGS. 12A and 12B), etc. Nothing in particular limits the method of generating convexity and concavity, and it may well be a method of utilizing tensile stress at the time of rolling of the flexible substrate 1206 (see FIGS. 12A and 12B), or it may be the scratches due to scratching at the time of winding up the substrate.

Back Surface Member

The back surface member 102 enhances the mechanical strength of the solar cell module and plays a role as a reinforcing member for preventing warpage and shrinkage/expansion due to thermal changes. In addition, for usage of the module outdoors, weathering property as well as load-withstanding property are required. Moreover, in order to make the module a roof material-integrated type solar cell module, a back surface member which can be processed into a shape as a roof material is preferable. As a material therefor, steel plates which are as strong as a conventional metal roof and non-ferrous plates which are extremely anti-corrosive can be used. The steel plate includes a steel plate subjected to a surface treatment, a coated steel plate, alloy in which other elements are mixed, or special steel, or otherwise, composite steel plates laminated with heat-insulating materials, etc. In general, hot dip zinc-plating steel sheets, galvalume steel sheets, hot-dip aluminum-plating carbon steel sheets, copper-plating steel sheets, polyvinyl chloride-coated steel sheets, fluorocarbon-coated polymer steel sheets, stainless steel sheets, laminated damping steel sheets, adiabatic zinc steel sheets, weatherproof steel sheets, and painted steel sheets are used. As non-ferrous plates, a copper plate, an aluminum alloy plate, a zinc alloy plate, a lead plate, a titanium plate and color painted plates thereof are used. Incidentally, in the present embodiments, the steel sheet is used as the back surface member 102, but the present invention is not limited thereto.

Back Surface Insulating Material

The back surface insulating material 103 is provided for securing insulation between the above-described photovoltaic element 101 and the above-described back surface member 102 and require insulating property. As a material therefor, there is preferable a material which can secure sufficient electric insulation, which furthermore is superior in long-term endurance to endure thermal expansion as well as thermal shrinkage, and which also has flexibility. A film to be suitably used includes nylon, polyethylene terephthalate, and polycarbonate. In addition, the above-described back surface insulating material may be coated onto the back surface member so as to form an integrated type material.

Sealing Material

The sealing material 105 is disposed on the front surface side (light-receiving surface side) as well as the back surface side of the photovoltaic element 101. The sealing material of the front surface side plays a role to bond the photovoltaic element with the front surface member, and the sealing material of the back surface side plays a role to bond the photovoltaic element 101 with the back surface protection material as well as to bond the back surface protection material with the back surface member 102. In addition, the sealing material is necessary to fill in and coat the concave and convex portions of the photovoltaic element, and to protect the photovoltaic element from severe outdoor environment such as thermal changes, humidity, shock, etc. Accordingly, adhesive property, flexibility, light-permeability, weatherproofness, filling property, heat resistance, freezing resistance, and shock resistance are required for the sealing material. Resins satisfying these requirements include ethylene-vinyl acetate copolymer (EVA), ethylene-methyl acrylate copolymer (EMA), ethylene-ethyl acrylate copolymer (EEA), polyolefin-based resin such as butyral resin, etc., urethane resin, silicone resin, and epoxy resin, etc. Among them, EVA has well-balanced physical properties for the purpose of a solar cell and is suitably used. In addition, it is preferable that the sealing material contains an ultraviolet absorbent for absorbing ultraviolet light which deteriorates the semiconductor layer.

Front Surface Member

The front surface member 104, which is disposed on the outermost surface of the solar cell module, require long-term reliability for outdoor exposure of the solar cell module such as weatherproofness, contamination resistance, and mechanical strength. A material therefor includes a fluorocarbon polymer resin or an acrylate resin. Among them, the fluorocarbon polymer resin, which is superior in weatherproofness and contamination resistance, is suitably used. Specifically, polyvinylidene fluoride resin, polyvinyl fluoride resin, and tetrafluoroethylene-ethylene copolymer, etc. can be used. From the point of view of weatherproofness, polyvinylidene fluoride resin is superior, but as for coexistence of weatherproofness and mechanical strength, and also transparency, tetrafluoroethylene-ethylene copolymer is superior. In order to improve the adhesive property of the front surface member with the sealing material 105, the front surface member desirably is subjected to a surface treatment such as corona treatment, plasma treatment, ozone treatment, UV irradiation, electron beam irradiation, and flame treatment, etc.

Electric Wire

Electric wire 106 is used for taking electricity from the photovoltaic element, for connecting the solar cell modules with each other and for connecting the solar cell module with an outside wiring. The wire is connected with a lead wiring member wired to the terminal position by soldering. The electric wire 106 composed of a cable and a connector is preferable since it can implement connection easily. As the cable, a cable subjected to insulation coating around the core wire of a conductor of soft copper, etc., and further subjected to protection coating in order to protect against contacts from outside is preferred. As the insulation-coating material, preferably used are vinyl chloride, chloroprene, crosslinked polyethylene, natural rubber, ethylene propylene, silicone resin, fluorocarbon resin, and inorganic insulating material, etc. As the protection coating material, preferably used are vinyl chloride, chloroprene, polyethylene, polyurethane, silicone resin, fluorocarbon resin, and a metal, etc.

The connector comprises two kinds of poles, namely a positive pole and a negative pole, which are formed so as to be able to connect them with each other, and for the housing portion thereof, polyethylene, polycarbonate, and polybutylene terephthalate, etc. are used.

Terminal Box

The terminal box 107 is disposed at the terminal position and plays a role to protect the electric wire taken out from the photovoltaic element against mechanical external forces, and at the same time, to protect the junction portion between the electric wire and the photovoltaic element against extraneous materials such as water and dust, etc. Therefore, a terminal box superior in heat resistance, water resistance, electric insulation, and aging property is required. In addition, the terminal box having a material with good adhesiveness as the sealing material is preferable.

Taking the above-described factors into account, as the terminal member, plastic is preferable, and taking the fire resistance into account, fire resistant plastics and ceramics, etc. are preferable.

For example, as plastic, there are noryl, polycarbonate, polyamide, polyacetal, denaturated PPO, polyester, polyarylate, unsaturated polyester, phenol resin, and epoxy resin, etc., which are engineering plastics, etc. superior in strength, shock resistance, heat resistance, stiffness, and aging property, etc. In addition, thermoplastic plastics such as ABS resin, PP, PVC, etc. can be used.

Fixing Member

The fixing member is the member for fixing the solar cell module, and there is no limitation to a particular one. For example, in the case where the solar cell module is a roof material-integrated type solar cell module, the member includes clip tingles, nails, and joint members with which the module is fixed on the roof. In addition, frames, bolts, etc. are also suitable for use as the member.

Examples of the present invention are described in detail as follows with reference to the drawings, but the present invention should not be limited to these examples.

EXAMPLE 1

Figure 2A:
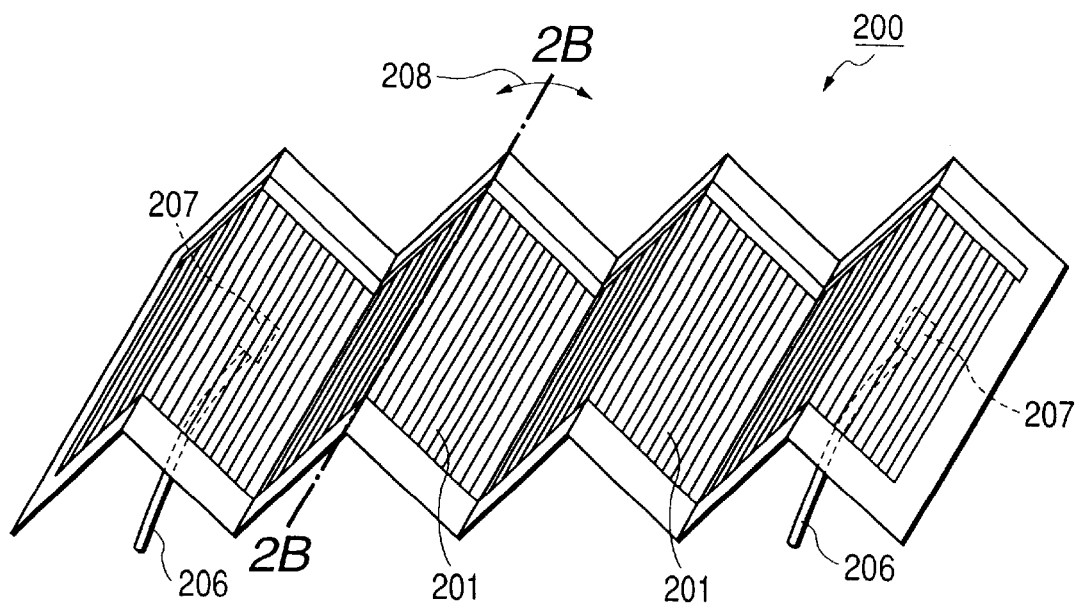
FIGS. 2A and 2B are a roof material-integrated type solar cell module of a hooked version type according to Example 1 of the present invention.
Figure 2B:
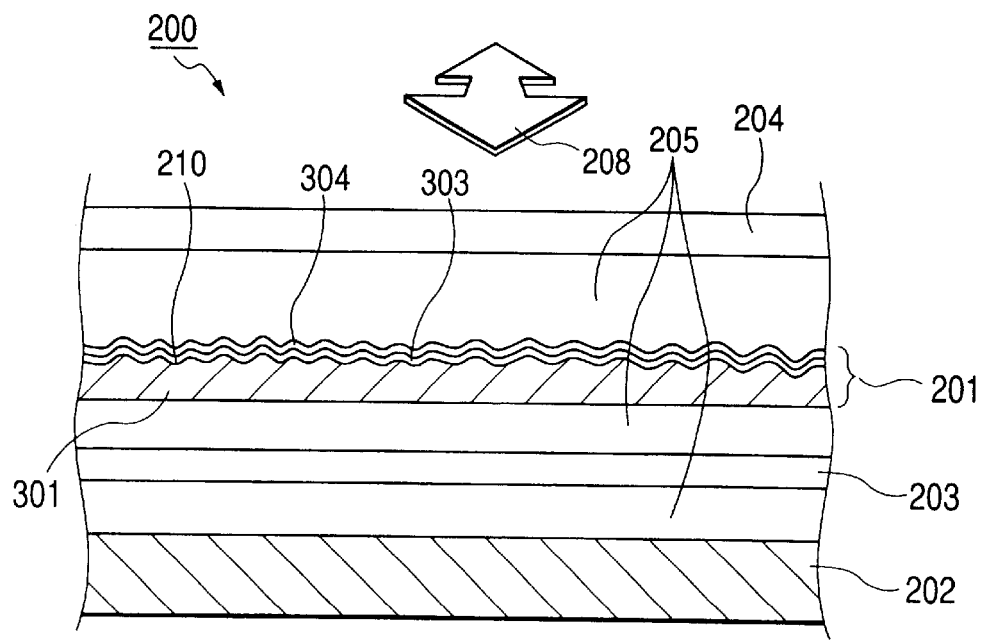

FIGS. 2A and 2B show a roof material-integrated type solar cell module 200 of a folded version type of Example 1 of the present invention. FIG. 2A is a perspective view, and FIG. 2B is a sectional view taken along the line 2B-2B of FIG. 2A.

For this building material-integrated type solar cell module 200, as in FIG. 2B, the photovoltaic element 201 is provided so as to be insulated with the back surface insulating material 203 and the front surface member 204 on the back surface member 202, and respective materials are adhered with the sealing material 205.

Electricity generated in the photovoltaic element 201 is, as in FIG. 2A, taken outside the solar cell module via the electric wire 206. The portion to which the electric wire is attached is provided with the terminal box 207 for the purpose of insulation protection as well as waterproofing.

In order to increase design freedom, the solar cell module 200 is deformed from a plane plate shape to another shape. The other shape is a folded version type in this example, and the module is processed to deform into a folded version type inclusive of the portion of the photovoltaic element 201. In this case, strain 208 generated by deformation-processing of the photovoltaic element 201 is directed in a substantially parallel direction to the surface grooves 210 of the flexible substrate 301.

As shown in FIG. 2B, each photovoltaic element 201 has a structure comprising as least a semiconductor photoactive layer 303 sandwiched by a conductive flexible substrate 301 and a transparent electrode layer 304. At the back surface side of this photovoltaic element 201, the insulating material 203 composed of a transparent resin film as well as the back surface member 202 are disposed, and at the front surface side, the front surface member 204 composed of a transparent resin film is disposed, and the sealing material 205 composed of an organic polymer resin is inserted therebetween, whereby the solar cell module 200 is formed.

This solar cell module 200 comprises, as its constituent component, the flexible substrate 301 having a plurality of substantially parallel surface grooves 210 formed on the surface thereof, for example, in the rolling step (cold rolling step) in the production step of the flexible substrate 301. The direction of the surface grooves 210 is the direction of rolling in the rolling step, and this is the longitudinal direction of the solar cell module 200 (left and right directions in FIG. 2A), that is, in the sectional view of FIG. 2B, the perpendicular direction to the drawing. Accordingly, with reference to the sectional view shown in the FIG. 2B, the flexible substrate 301, the semiconductor photoactive layer 303, and the transparent electrode layer 304 constituting the photovoltaic element 201 are all wave-shaped in the left and right direction (2B—2B direction in FIG. 2A).

The above-described solar cell module 200 is deformed so that the tensile strain 208 generates in a substantially parallel direction to the direction of these front surface grooves 210. At that time, the magnitude of the strain due to folding to be applied is not less than the crack generating critical value of the semiconductor photoactive layer 303 having a comparatively small crack generating critical value. In the case of the folded version type of this example, the module is repeatedly folded in a zigzag shape so that the folded line (ridge) is directed parallel to the short side direction of the solar cell module 200 (FIG. 2A).

If the tensile strain is applied to the photovoltaic element 201 comprising the flexible substrate 301 in a substantially perpendicular direction to the surface grooves 210, as already described with FIG. 12, the strain is concentrated on a portion where the total film thickness of the photovoltaic element 201 is small, and thus the large strain is applied to concave portions such as scratches or craters, etc. in the surface grooves 210 (see the concave portions 1211 in FIGS. 12A and 12B), and the strain easily exceeds the crack generating critical value of the semiconductor photoactive layer 303 and cracking occurs.

However, in the case of the above-described solar cell module 200, the tensile strain 208 is applied in a substantially parallel direction to the surface grooves 210. This means that the tensile strain is applied in a direction of making the concavity and convexity of the surface grooves 210 small, and consequently, the strain concentration hardly takes place. In addition, scratches and craters are elongated in the direction of the strain, and therefore the strain concentration hardly takes place therein.

Thus, in the case where the photovoltaic element is bent, the tensile strain applied to the direction of the surface grooves 210 of its flexible substrate 301 can prevent the cracking in the semiconductor photoactive layer 303.

The production method will be described in detail as follows.

Photovoltaic Element

At first, the photovoltaic element 201 is produced. This step will be first described.

Figure 3A:
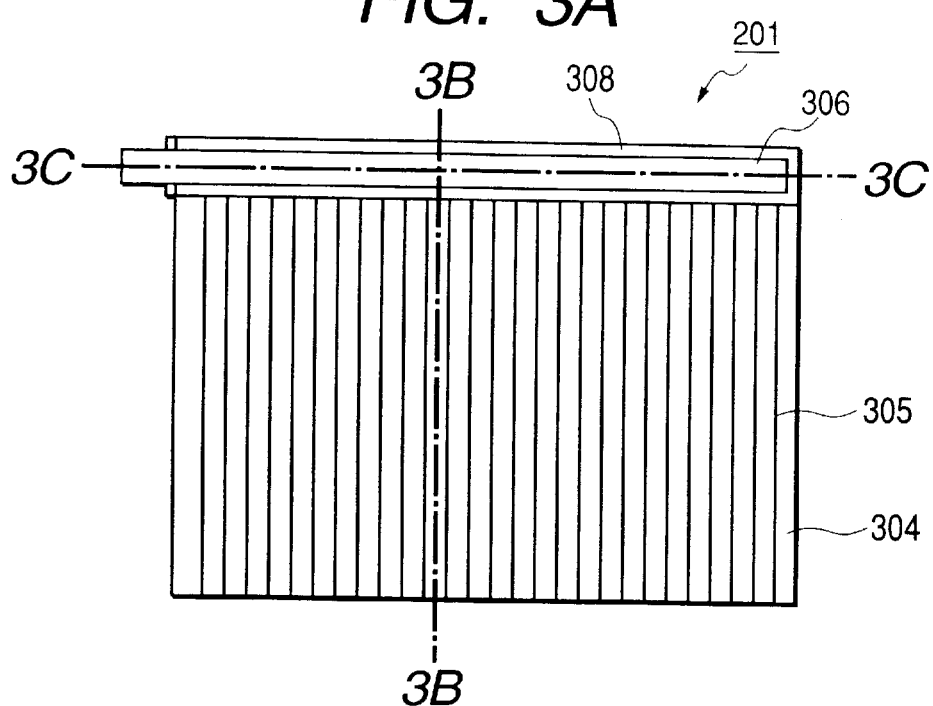
FIGS. 3A, 3B, and 3C show a photovoltaic element which is a basic constituent element of the solar cell module in FIGS. 2A and 2B.
Figure 3B:
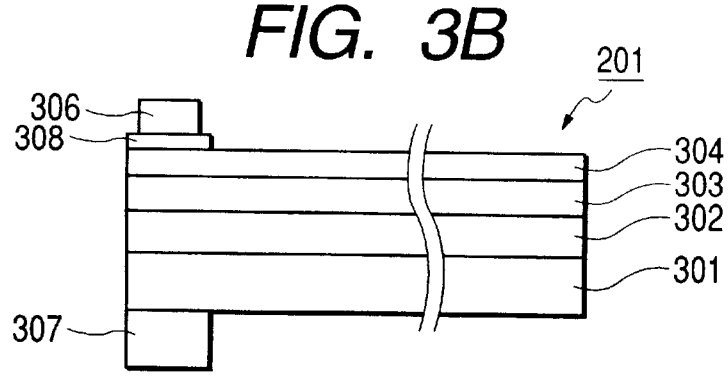
Figure 3C:
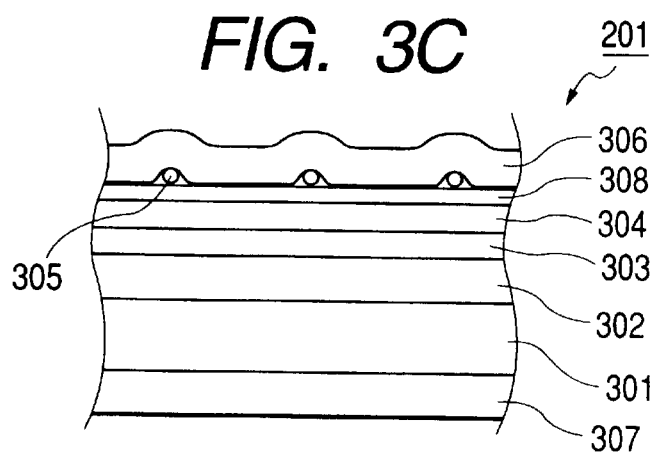

FIGS. 3A, 3B and 3C show the photovoltaic element 201 which is a basic constituent component of the solar cell module in Example 1. FIG. 3A is a plan view, FIG. 3B is a sectional view taken along the line 3B—3B of FIG. 3A, and FIG. 3C is a sectional view taken along the line 3C—3C of FIG. 3A.

The conductive flexible substrate 301 is a cleaned stainless steel substrate, which is surface treated with nitric acid-hydrofluoric acid after rolling and annealing, and on which coarse concave-convex portions and concave-convex portions having a size not more than 1 $\mu$m coexist (not shown in the drawings). These convex-concave portions correspond to the surface grooves 210 as shown in FIG. 2B and are in a substantially parallel direction of the rolling direction. In addition, the rolling provides a desired thickness by cold rolling. The surface grooves 210 are intentionally made larger and are provided so as to scatter light for the purpose of more efficient use of the solar lights which the photovoltaic elements have received.

On the above-described flexible substrate 301, an Al layer (film thickness: 2000 Å) and a ZnO layer (film thickness: 12000 Å) were formed as the back surface reflecting layer 302 using the sputtering method.

Next, as the semiconductor photoactive layer 303, using the plasma CVD method, an n-type a-Si layer was formed from a gaseous mixture of $SiH_4$, $PH_3$ and $H_2$, an i-type a-Si layer was formed from a gaseous mixture of $SiH_4$ and $H_2$, and a p-type microcrystalline sac-Si layer was formed from a gaseous mixture of $SiH_4$, $BF_3$ and $H_2$, thereby forming a tandem-type a-Si photoactive layer having a layer structure consisting of n-layer: 150 Å film thickness/i-layer: 4000 Å film thickness/p-layer: 100 Å film thickness/n-layer: 100 Å film thickness/i-layer: 800 Å film thickness/p-layer: 100 Å film thickness. Next, as the transparent electrode layer 304, an $In_2O_3$ thin film (film thickness: 650 Å) was formed by evaporation under an $O_2$ atmosphere and by using the resistance-heating method. Up to this point, while the flexible substrate 301 in a roll state was transferred by the roll-to-roll system, film formation was continuously conducted.

Next, the substrate having the layers formed thereon was cut by a roll cutter to form sheets. This cutting serves to determine the outer periphery (size and shape) of the photovoltaic element 201. In the outer periphery of the photovoltaic element, a portion of the transparent electrode layer 304 was removed in order to prevent the generation of a short circuit between the flexible substrate 301 and the transparent electrode layer 304 at the time of cutting, thereby forming an effective region electrically separated from the short-circuited portion (not shown in the drawings). As the method therefor, there was employed the electrolytic etching method of permitting electric currents to flow through the portion to be removed of the transparent electrode layer 304 in an acidic electrolyte so as to remove the portion of the transparent electrode layer 304.

Thereafter, in order to electrically restore the defect portion generated at the time of film formation of the above-described layers, electric current was permitted to flow through the defect portions in the electrolyte and at the same time remove the transparent electrode layer 304 in the defect portion which becomes a cause of short circuiting.

Thereafter, a soft copper foil 7.5 mm wide, 285 mm long and 100 um thick was used as a negative busbar electrode 307 and was connected, using the laser welding method, to the end portion of the back surface side of the flexible substrate 301. The negative busbar electrode 307 plays the role of the negative electrode of the photovoltaic element. As described above, the negative busbar electrode 307 was connected by laser welding. It is feared that laser welding generates short circuit in the welded portion between the flexible substrate 301 and the transparent electrode layer 304, and therefore the region where the negative busbar electrode 307 is mounted is a region other than the effective region.

Thereafter, the insulating layer 308 is provided along one side of the light-receiving surface side so as to face the negative busbar electrode 307 at the end of the photovoltaic element. The insulating layer 308 plays a role of insulation so as to form the positive busbar electrode 306 thereabove. The arrangement of the positive busbar electrode 306 in the position opposing the negative busbar electrode 307 makes easy the assembly of bypass circuits or circuit of photovoltaic elements in series since the positive electrode and the negative electrode of the photovoltaic element are disposed adjacent to each other. As described above, the negative busbar electrode 307 is formed in positions other than the effective regions, and therefore the positive busbar electrode 306 is disposed in the portion, whereby efficient use of the effective region can be conducted. In addition, since the portion other than the effective region is, as described above, short-circuited with the flexible substrate 301, in the case where the positive busbar electrode 306 is formed, the insulating layer 308 is necessary between the positive busbar electrode 306 and the transparent electrode layer 304. As the insulating layer 308, a polyimide-based insulating tape 7.5 mm wide, 280 mm long and 200 um thick was bonded. At that time, the insulating layer 308 was bonded in such a manner that the insulating layer protruded a little so as to cover the edge portion of the left side of the photovoltaic element as shown in FIG. 3B.

Thereafter, in order to form the collector electrode 305, a carbon-coated wire comprising a copper wire of 100 $\mu$m diameter on which a carbon paste was coated was disposed and wired on the transparent electrode layer 304 and the insulating layer 308 at intervals of 5.6 mm.

And on the upper portion of the insulating layer 308, the positive busbar electrode 306 was formed in order to concentrate electricity from the collector electrode 305. As the positive busbar electrode 306, a silver-plated copper foil 5.5 mm wide, 285 mm long and 100 $\mu$m thick was used, and it was bonded onto the polyimide tape which was the insulating layer 308. Thereafter, under the condition of 200° C., 3 kg/cm² and 50 seconds, the collector electrode 305 and the positive busbar electrode 306 are simultaneously fixed with heat and pressure. One side of the positive busbar electrode 306 was arranged to extend outward from the photovoltaic element as shown in FIGS. 3A and 3B. It becomes the lead portion at the time when the photovoltaic elements are electrically connected with each other.

Photovoltaic Element Group

Next, a plurality of photovoltaic elements were electrically connected in series to form a photovoltaic element group. The step of connecting the solar cell elements will be described.

Figures 4A, 4B, 4C:
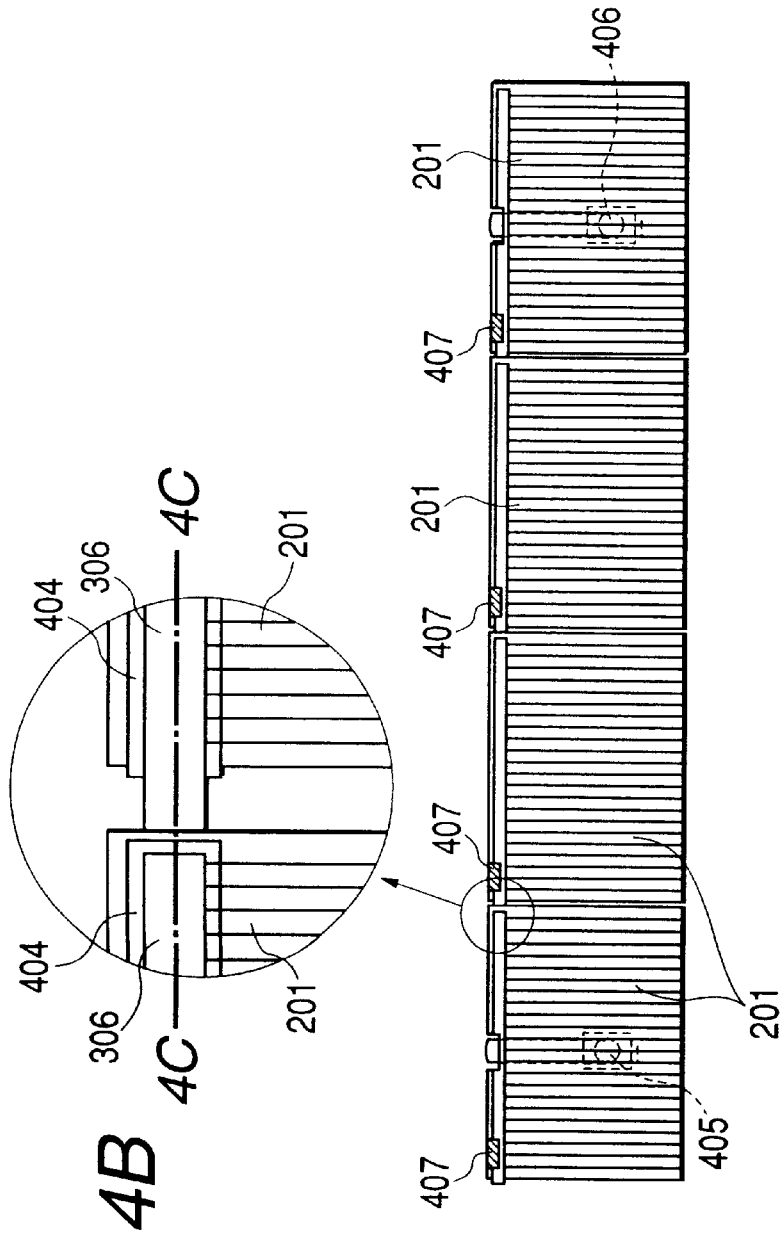
FIGS. 4A, 4B and 4C show a photovoltaic element group which is a constituent element of the solar cell module in FIGS. 2A and 2B.

FIGS. 4A, 4B and 4C show the photovoltaic element group being a constituent component of the solar cell module in Example 1. FIG. 4A is a plan view, FIG. 4B is a partially enlarged view, and FIG. 4C is a sectional view along a line 4C—4C in FIG. 4A. The photovoltaic element group is formed by connecting a plurality of photovoltaic elements 201 shown in FIG. 3 having been electrically connected in series or in parallel to form a plane level size. Each photovoltaic element 201 has the bypass diode 407 mounted thereon and the electrode takeout portions 405 and 406 for taking electricity out from these plurality of photovoltaic elements 201.

Here, four photovoltaic elements 201 were horizontally aligned in one line, and thereafter, as shown in FIGS. 4B and 4C, the positive busbar electrode 306 of one photovoltaic element 201 was connected by soldering with the negative busbar electrode 307 of another photovoltaic element 201 which was adjacent to the one photovoltaic element 201. The positive busbar electrode 306 is, as described above, arranged to be longer in advance in order to provide connection, and likewise the insulating layer 404 under the positive busbar electrode 306 is arranged to be longer than the outer frame. Thus, at the end of the photovoltaic element 201, the protruded insulating layer 404 prevents short circuits between the positive busbar electrode 306 and the flexible substrate. In addition, the gap between the photovoltaic elements 201 is 2 mm, and the highly dense disposition increases the output of a solar cell module.

In order to take the output from the photovoltaic element group, the positive side electrode takeout portion 405 and the negative side electrode takeout portion 406 were provided. The electrode takeout portions 405 and 406 were provided at the back surface side of the photovoltaic element group, and their position is determined in accordance with the design of the solar cell module.

Figure 5A:
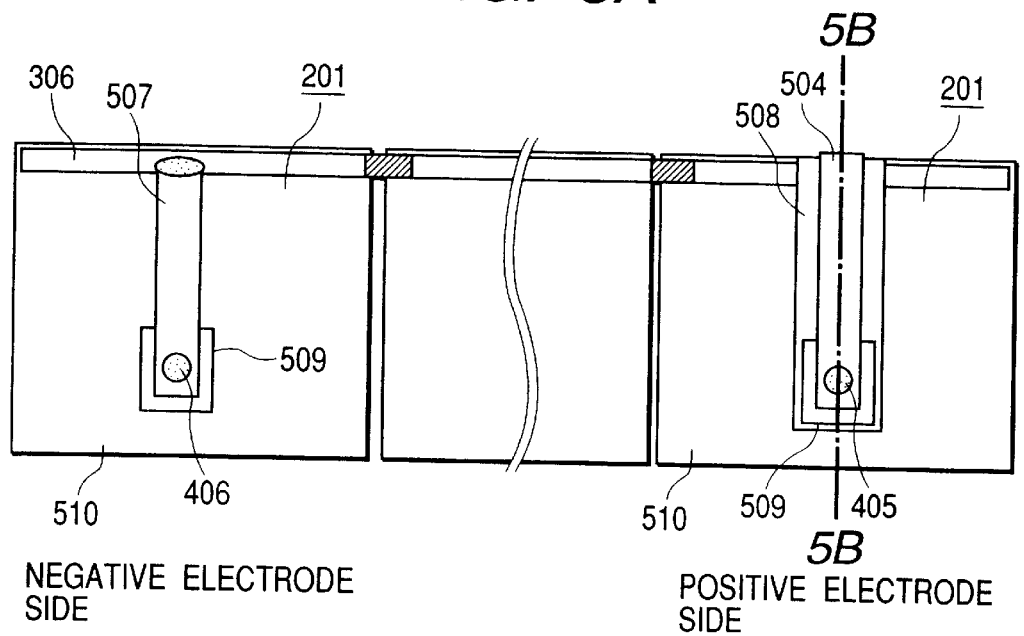
FIGS. 5A and 5B show the electrode-taking out portion disposed in the photovoltaic element group in FIGS. 4A, 4B and 4C.
Figure 5B:
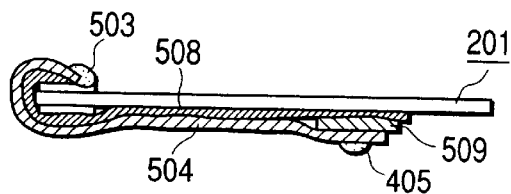

FIGS. 5A and 5B are a plan view and a sectional view of the electrode takeout portion provided in the photovoltaic element group in FIGS. 4A to 4C.

The electrode takeout portions 405 and 406 were disposed at the back surface side of the photovoltaic element group, that is, on the stainless steel sheet being the flexible substrate 510 of the photovoltaic element 201. The positive side electrode takeout portion 405 was wired from the positive busbar electrode 503 of the photovoltaic element 201 at the end of the positive side using the positive terminal wiring member 504. The negative side electrode takeout portion 406 was wired from the negative busbar electrode 306 of the photovoltaic element 201 at the end of the negative side using the negative terminal wiring member 507. Using a soft copper foil 40 um thick and 20 mm wide as the terminal wiring members 504 and 507, the positive terminal wiring member 504 was bonded via the insulating material 508 to the stainless steel substrate of the photovoltaic element 201 so as to be insulated from the substrate. In addition, since cables are soldered at the electrode takeout portions 405 and 406 in a subsequent step, and immediately under the terminal wiring members 504 and 507, glass-woven cloth tapes were provided as heat resistant materials 509.

Figure 6A:
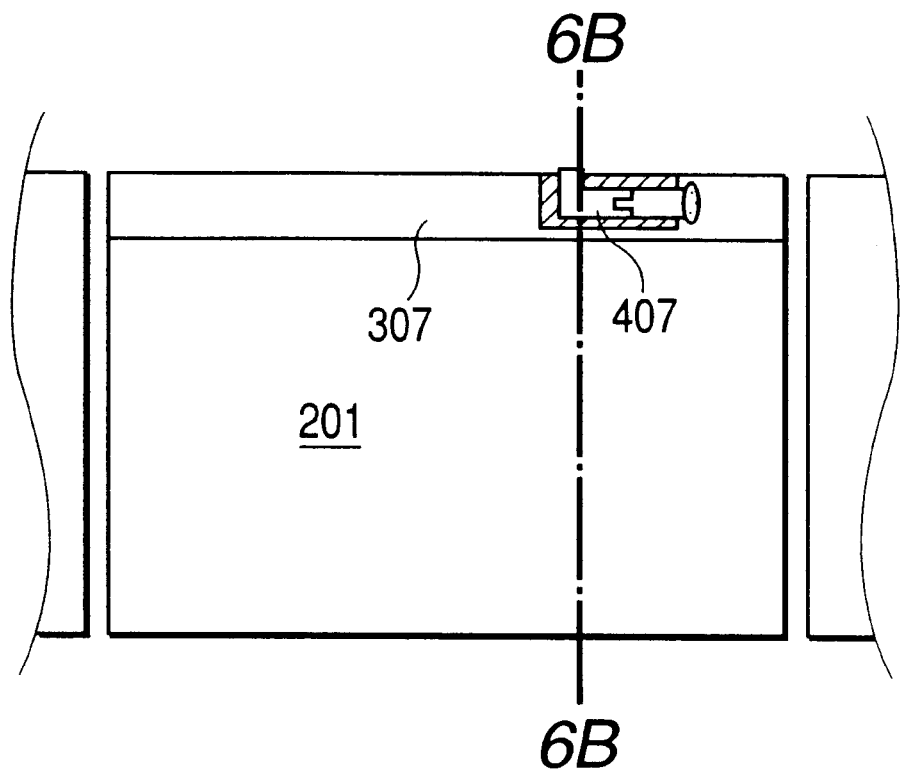
FIGS. 6A and 6B show a portion of bypass diode disposed in the photovoltaic element group in FIGS. 4A, 4B and 4C.
Figure 6B:
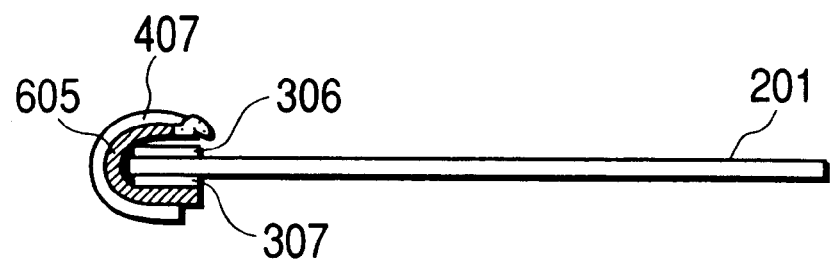

FIGS. 6A and 6B are respectively a plan view and a sectional view of a bypass diode provided to the photovoltaic element group in FIGS. 4A to 4C.

The bypass diode 407 was mounted on the negative busbar electrode 307 of each photovoltaic element 201. The bypass diode 407 is necessary to bypass electricity when a portion of the solar cell module is covered with shadow and any of the photovoltaic elements 201 stops generating electricity. The bypass circuit was formed by connecting the P side of the bypass diode 407 to the negative busbar electrode 307 and connecting the N side of the bypass diode 407 to the negative busbar electrode 306. Without the bypass diode, the photovoltaic element 201 covered with shadow does not generate any power but functions as a diode. In this case, the voltage of the photovoltaic element 201 which generates power by receiving light is applied backward to the photovoltaic element 201 functioning as a diode and will destroy it. As the bypass diode 407, a 1.5 mm square flat diode chip comprising a ribbon was used. In addition, the bypass diode 407 was disposed on an insulating material 605 provided on the negative busbar electrode 307. The ribbon of the bypass diode 407 has one side shaped with a right angle, and the ribbon extends from the back side of the photovoltaic element 201 to the front side and is connected to the positive busbar electrode 306. Connection is conducted by soldering, and the ribbon is composed of a soft copper foil 0.1 mm thick.

Lastly, taking appearance into account, a black ornament tape (not shown in the drawings) was bonded to the positive busbar electrode 306 of the photovoltaic element 201.

Module Production

Next, the above-described photovoltaic element group was subjected to a vacuum laminate treatment described as follows to produce a module. The lamination step of sealing this photovoltaic element group with a resin will be described.

Figure 7A:
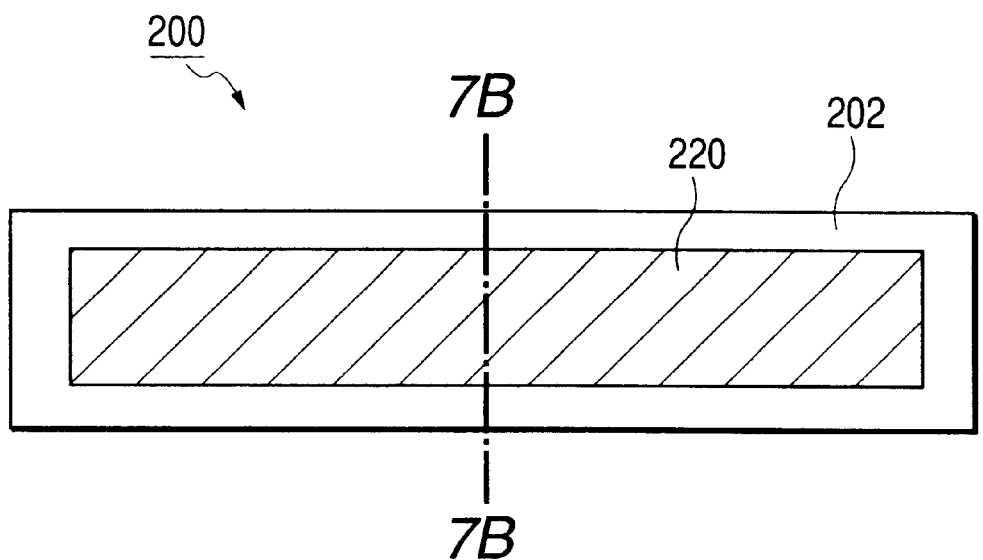
FIGS. 7A and 7B show a flat-plate shaped solar cell module produced by lamination-processing the photovoltaic element group in FIGS. 4A, 4B and 4C.
Figure 7B:
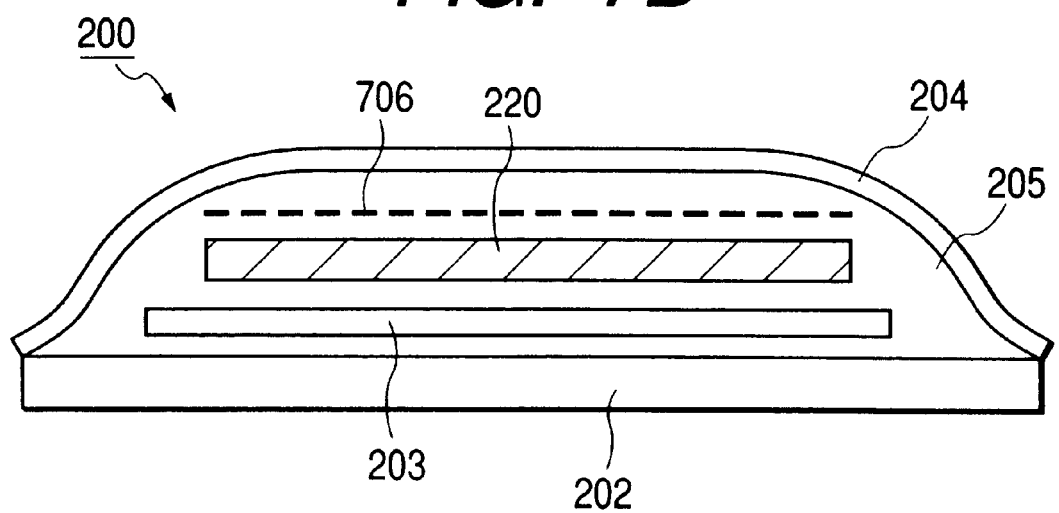

FIGS. 7A and 7B are respectively a plan view and a sectional view of the plane-shaped solar cell module 200 subjected to the lamination treatment.

In FIGS. 7A and 7B, the front surface material is numbered as 204, the sealing material is numbered as 205, the photovoltaic element (photovoltaic element group) is numbered as 220, the back surface insulating material is numbered as 203, and the back surface member is numbered as 202. More concretely, the front surface member 204 is ETFE (ethylenetetrafluoroethylene copolymer) film, and the sealing material 205 is EVA (ethylene-vinyl acetate copolymer). The sealing material 205 at the light-receiving surface side is impregnated with surface protection reinforcing material 706, to prevent external scratches. The surface protection reinforcing material 706 is glass nonwoven fabric. The back surface insulating material 203 is a PET (polyester) film. The back surface member 202 is a zinc-painted steel plate.

The lamination treatment is conducted by stacking the back surface member 202/an integrated lamination body comprising the back surface insulating materials 203 and the sealing material 205 at the back surface side/the photovoltaic element (photovoltaic element group) 220/the front surface protection reinforcing material 706/an integrated lamination body comprising the front surface sealing material 205 at the front surface side and the front surface member 204 in the above-described order, and conducting vacuum heating with a single vacuum system laminate device. The vacuum conditions at that time were a pumping speed of 76 Torr/sec. and a vacuum degree of 5 Torr for 30 minutes to conduct exhaustion. Thereafter, the laminate device was put into a 160° C. hot air oven to heat it for 50 minutes. At that time, EVA is placed in an environment of 140° C. or more for 15 minutes or more. By this treatment, EVA was melted and crosslinked. This made it possible to produce a plane solar cell module.

The portions of the back surface member 202 corresponding to the electrode takeout portions of the positive side as well as the negative side of the photovoltaic element (photovoltaic element group) 220 were provided with a hole in advance (not shown in the drawings).

Lastly, the plane-type solar cell module was subjected to molding-processing to form a folded-version type roof material-integrated solar cell module as shown in FIG. 2A by a vender machine. At that time, the portion of the photovoltaic element (photovoltaic element group) 220 to be extended in a convex shape was subjected to processing so that strain was applied at a tolerance angle within ±1° in a substantially parallel direction to the surface grooves 210 of the flexible substrate 301 of the photovoltaic element.

EXAMPLE 2

Figure 8A:
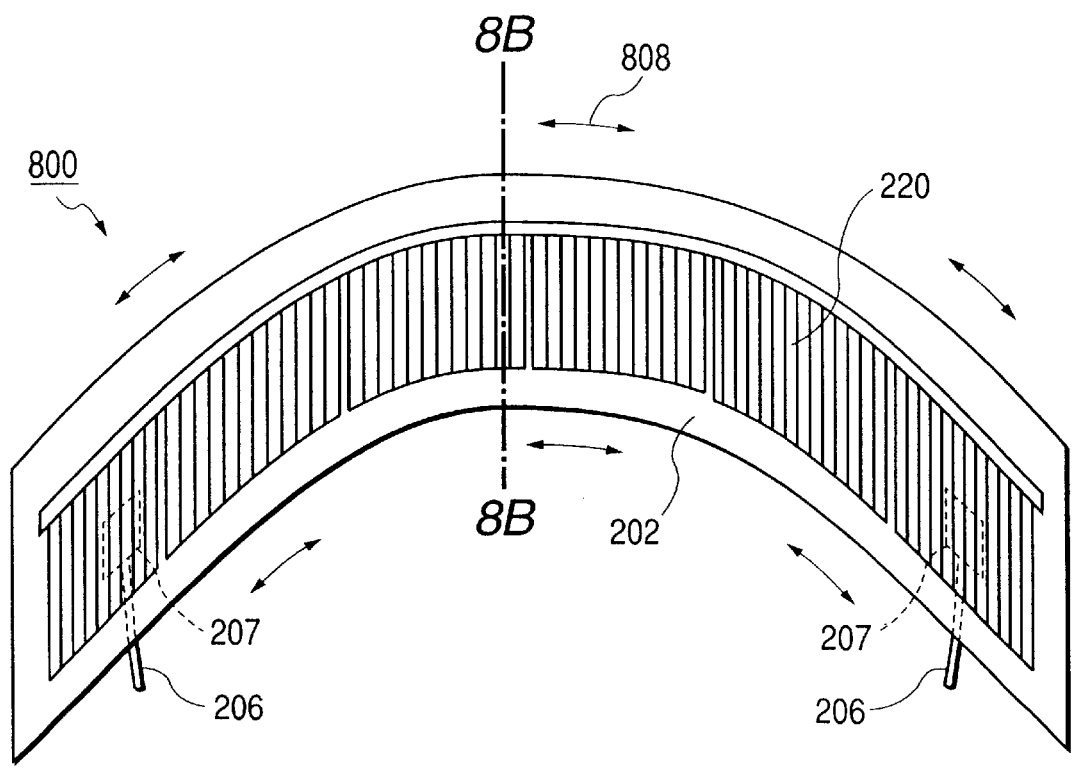
FIGS. 8A and 8B show a convex-curved type solar cell module according to Example 2 of the present invention.
Figure 8B:
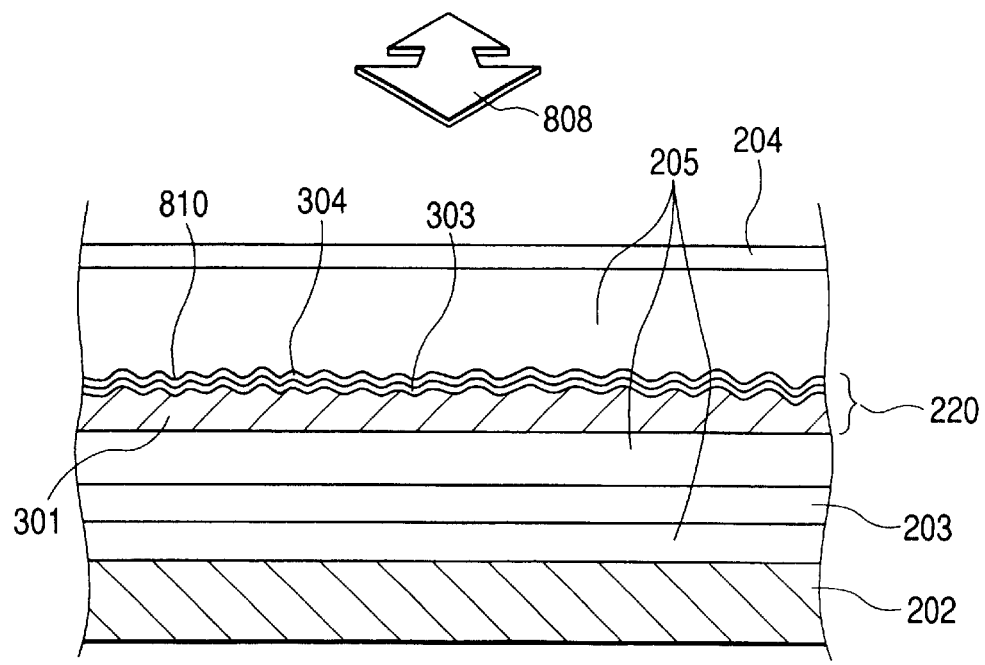

FIGS. 8A and 8B show a convex-curved type solar cell module 800 of Example 2 of the present invention. FIG. 8A is a perspective view, and FIG. 8B is a sectional view taken along a line 8B–8B in FIG. 8A. In that case, in order to increase design freedom, the solar cell module 800 inclusive of the portion of the photovoltaic element 220 is processed to be in a convex-curved shape. This convex-curved solar cell module 800 is bonded with an adhesive agent in a carport shape for use.

As shown in FIG. 8B, the photovoltaic element 220 is provided above the back surface member 202 and insulated by the back surface insulating material 203 and the front surface member 204, and each material is bonded together with the sealing material 205.

Electricity generated by the photovoltaic element 220 is taken outside the solar cell module via the electric wire 206. For the purpose of insulating protection as well as waterproofing, a terminal box 207 is provided to the portion to which the cables are attached. Also in this example, the tensile strain 808 due to bending-processing of the photovoltaic element 201 is directed in a substantially parallel direction to the surface grooves 210 of the flexible substrate 301, as the feature of the present invention.

The production method is the same as in Example 1, but the last processing for the convex-curved shape was conducted not with the vender machine used in Example 1 but with a roller former machine. In addition, the flexible substrate 301 is a stainless steel substrate, and it is subjected to bright annealing treatment as the surface treatment, which appears almost planar and smooth. However, slight concave-convex portions exist. The concave-convex portions correspond to the above-described surface grooves 810 and are in a substantially parallel direction to the rolling direction.

Comparative Example 1

Figure 9A:
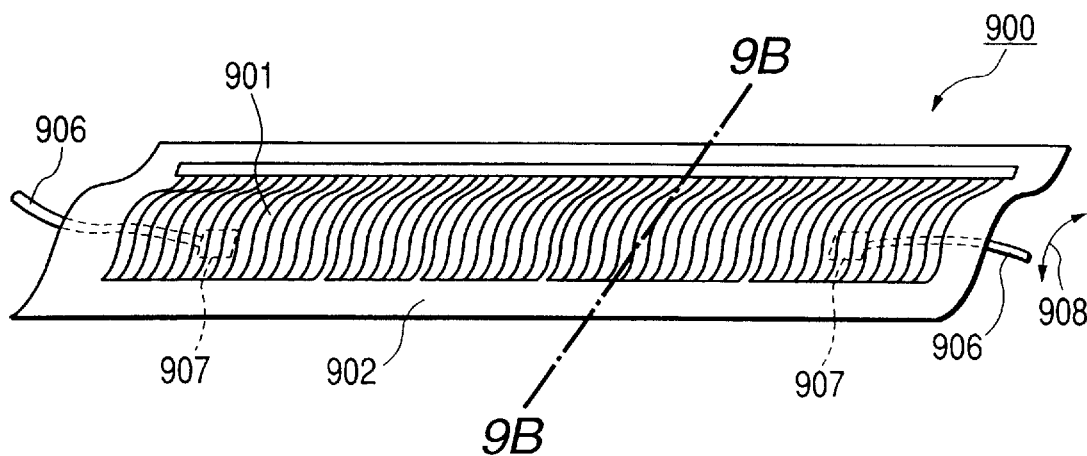
FIGS. 9A and 9B show a solar cell module of a convex-curved type according to Comparative Example 1.
Figure 9B:
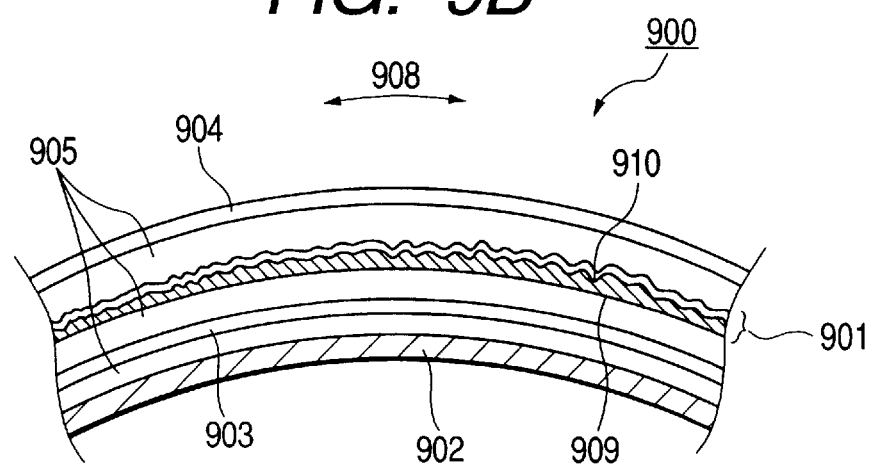
Figure 10A:
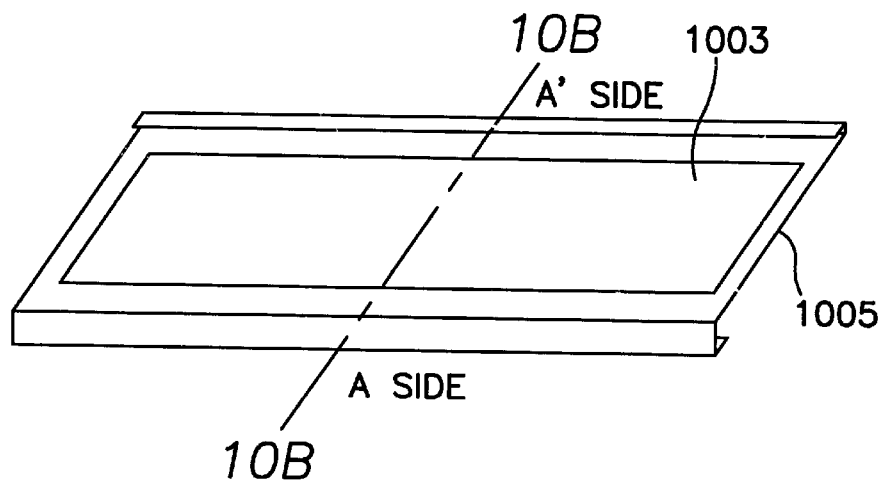
FIGS. 10A and 10B show a representative roof material-integrated type solar cell module.
Figure 10B:
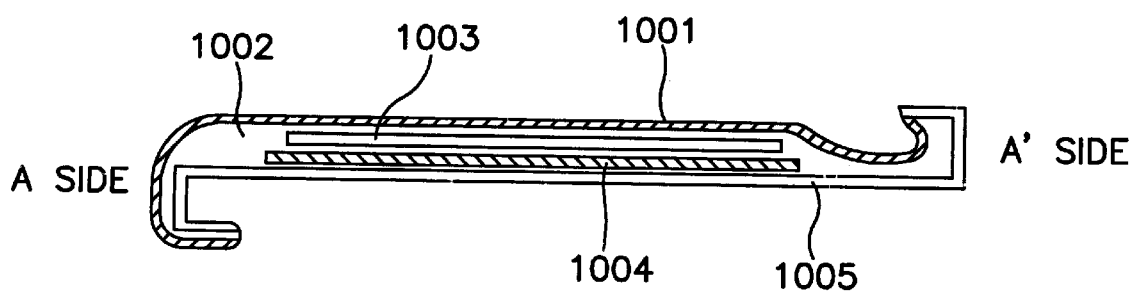
Figure 11A:
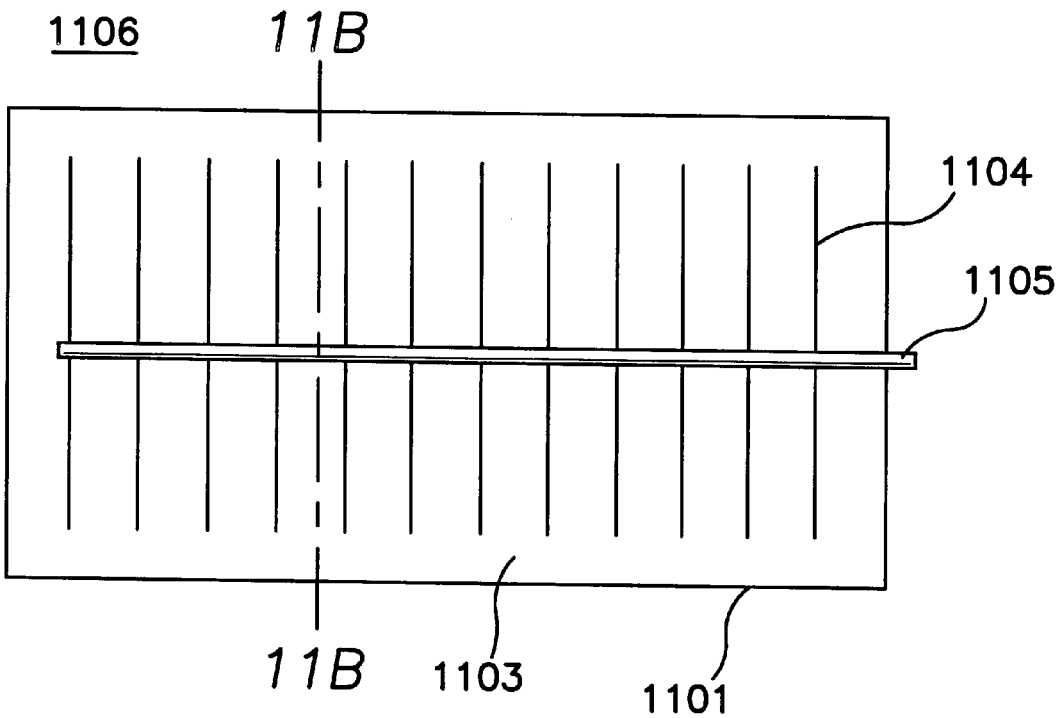
FIGS. 11A and 11B show a representative photovoltaic element.
Figure 11B:
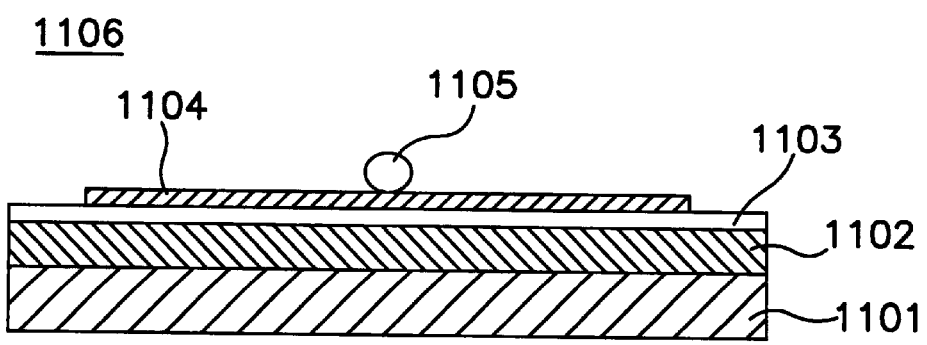

FIGS. 9A and 9B are respectively a perspective view and a sectional view of the convex-curved type solar cell module 900 of Comparative Example 1. In this case, in order to increase design freedom, the solar cell module 900 inclusive of the portion of the photovoltaic element is processed in a convex-curved shape.

As shown in FIG. 9B, the photovoltaic element 901 is provided above the back surface member 902 and insulated by the back surface insulating material 903 and the front surface member 904, and each material is bonded together with the sealing material 905.

Electricity generated in the photovoltaic element 901 is taken outside the solar cell module via the electric wire 906. For the purpose of insulating protection as well as waterproofing, a terminal box 907 is provided to the portion to which the cables are attached. Incidentally, unlike in the case of the above-described Examples 1 and 2 of the present invention, strain 908 due to processing of the photovoltaic element 901 is directed in a substantially perpendicular direction to the surface grooves 910 of the flexible substrate 909.

The production method is the same as in Example 1, but the last processing for the convex-curved shape was conducted not with the vender machine in Example 1 but with a roller former machine. In addition, the flexible substrate 909 is a cleaned stainless steel substrate, and as the front surface treatment, it is subjected to treatment with nitric acid-hydrofluoric acid after rolling and annealing, and as a result, coarse concave-convex portions and concave-convex portions 910 having a size not more than 1 um coexist. The convex-concave portions 910 correspond to the surface grooves 910 of the present invention and are directed in a substantially parallel direction to the rolling direction. The surface grooves 910, which are intentionally made larger, are provided so as to scatter light for the purpose of more efficient use of the solar light received by the photovoltaic elements 901.

Experiment 1

The solar cell modules produced in Examples 1 and 2 of the present invention and Comparative Example 1 are evaluated in the forward bias high-temperature high-humidity test as an accelerated deterioration test toward migration.

The forward bias high-temperature high-humidity test will be described as follows.

The solar cell module is placed under the environment of 85° C./85% (relative humidity). In this case, either the interior of the test device is provided with a shaded environment or the light-receiving surface side of the test sample is shaded so that no light is irradiated onto the test sample. Under this environment, the wiring is conducted so that an optimum operation voltage can be applied to the forward direction in the diode component inside the solar cell, and the voltage is applied for 2000 hours. Thereafter, the solar cell module is taken out, and each cell of the photovoltaic elements is measured on low illuminance Voc (the open voltage under illuminance of 200 Lx), and a variation ratio is obtained from the initial value prior to the test. Decrease in low illuminance Voc represents decrease in resistance of shunt resistance due to a junction defect inside the photovoltaic element.

The evaluation result is shown in Table 1 in accordance with the following evaluation standards.

TABLE 1

| | Test result |
|---|---|
| Example 1 | ⊚ |
| Example 2 | ⊚ |
| Comparative Example 1 | x |

⊚: the case where variation of low illuminance Voc is less than 1.0%
o: the case where variation of low illuminance Voc is not less than 1.0% but less than 3.0%
Δ: the case where variation of low illuminance Voc is not less than 3.0% but less than 5.0%
x: the case where variation of low illuminance Voc is not less than 5.0%

As described above, a good result was not obtained from the test for Comparative Example 1 where the photovoltaic element had the strain directed in a substantially perpendicular direction to the surface grooves of the flexible substrate.

As described above, according to the present invention, when the solar cell module is processed to deform in the portion inclusive of the photovoltaic element, the strain due to processing generated in at least one portion of the photovoltaic element is directed in a substantially parallel direction to the surface grooves of the flexible substrate of the photovoltaic element, and therefore, cracks in the semiconductor photoactive layer of the photovoltaic element can be minimized, and a more reliable solar cell module can be obtained.

This makes it possible to subject the solar cell module to deformation-processing within a desired region without ascertaining the position of the photovoltaic element, that is, whether or not the desired region includes the point where the photovoltaic element exists inside the solar cell module. In addition, a conventional roof-material molding machine can be used for the deformation-processing of the solar cell module. Accordingly, it is possible to promote realization of the roof material-integrated type solar cell module which can be processed by a conventional roof molding machine and have design freedom, low production cost and reliability.

What is claimed is:

1. A solar cell module comprising a front surf ace member disposed on a front surface side of a photovoltaic element having at least a semiconductor photoactive layer on a flexible substrate, a back surface member disposed on a back surface side of the photovoltaic element, and a sealing material interposed therebetween, wherein the flexible substrate has a plurality of substantially parallel surface grooves formed on a surface thereof at the semiconductor photoactive side of the flexible substrate, and wherein at least one portion of the solar cell module is processed to deform in such a direction that strain generated in a substantially parallel direction to the surface grooves is applied to the photovoltaic element.

2. The solar cell module according to claim 1, wherein the strain is a strain in a stretching direction.

3. The solar cell module according to claim 1, wherein the strain has a value not less than a crack generating critical value of the semiconductor photoactive layer.

4. The solar cell module according to claim 1, wherein the flexible substrate is a conductive substrate.

5. The solar cell module according to claim 4, wherein the conductive substrate is formed of a stainless steel.

6. The solar cell module according to claim 1, wherein the surface grooves are concavity and convexity generated in a rolling step in a production step of the flexible substrate.

7. The solar cell module according to claim 6, wherein the rolling step is a cold rolling step.

8. The solar cell module according to claim 1, wherein the semiconductor photoactive layer is composed of an amorphous silicon-based semiconductor.

9. The solar cell module according to claim 1, wherein the back surface member is formed of a metal sheet.

10. The solar cell module according to claim 1, wherein the front surface member is composed of a transparent resin film.

11. The solar cell module according to claim 1, wherein the sealing material is composed of an organic polymer resin.

12. The solar cell module according to claim 1, wherein an insulating material is provided at a back surface side of the photovoltaic element, and the insulating material is composed of a transparent resin.

13. The solar cell module according to claim 1, wherein the solar cell module is a building material-integrated solar cell module formed by bending the solar cell module to form a shape of a building material.

14. A production method of producing a solar cell module comprising the steps of:
disposing a front surface member on a front surface side of a photovoltaic element having at least a semiconductor photoactive layer on a flexible substrate,
disposing a back surface member on a back surface side of the photovoltaic element,
interposing a sealing material therebetween, forming a plurality of substantially parallel surface grooves on a surface of the flexible substrate at the semiconductor photoactive layer side, and
processing at least one portion of the solar cell module to deform in such a direction that strain generated in a substantially parallel direction to the surface grooves is applied to the photovoltaic element.

15. The production method according to claim 14, wherein the deformation-processing step is conducted in such a direction that the strain becomes a strain in a stretching direction.

16. The production method according to claim 14, wherein the deformation-processing is conducted in such a manner that the strain has a value not less than a crack generating critical value of the semiconductor photoactive layer.

17. The production method according to claim 14, wherein the flexible substrate is a conductive substrate.

18. The production method according to claim 17, wherein the conductive substrate is formed of a stainless steel sheet.

19. The production method according to claim 14, wherein the surface grooves are formed in a rolling step in a production step of the flexible substrate.

20. The production method according to claim 19, wherein the rolling step is a cold rolling step.

21. The production method according to claim 14, wherein the semiconductor photoactive layer is composed of an amorphous silicon-based semiconductor.

22. The production method according to claim 14, wherein the back surface member is composed of a metal sheet.

23. The production method according to claim 14, wherein the front surface member is composed of a transparent resin film.

24. The production method according to claim 14, wherein the sealing material is composed of an organic polymer resin.

25. The production method according to claim 14, wherein an insulating material is provided at a back surface side of the photovoltaic element, and the insulating material is composed of a transparent resin film.

26. The production method according to claim 14, wherein the solar cell module is bent in a shape of a building material to produce a building material-integrated solar cell module.

27. An installation method of installing a solar cell module, wherein a solar cell module set forth in any one of claims 1 to 13 is fixed on an installation surface by using a fixing member.

28. A photovoltaic power generation system comprising a solar cell module set forth in any one of claims 1 to 13 and a power conversion device connected to the solar cell module.

* * * * *

UNITED STATES PATENT AND TRADEMARK OFFICE
CERTIFICATE OF CORRECTION

PATENT NO. : 6,291,761 B1
DATED : September 18, 2001
INVENTOR(S) : Takeshi Takada et al.

It is certified that error appears in the above-identified patent and that said Letters Patent is hereby corrected as shown below:

Column 1,
Line 40, "houses," should read -- house, --.

Column 2,
Line 6, "of-view." should read -- of view. --;
Line 25, "is" should read -- are --; and
Line 28, "is" should read -- are --.

Column 3,
Line 16, "can not" should read -- cannot --.

Column 4,
Line 12, "concaveconvex" should read -- concave-convex --; and
Line 48, "convex-concave" should read -- concave-convex --.

Column 9,
Line 7, "substrate;" should read -- substrate, --.

Column 11,
Line 6, "are" should read -- is --;
Line 55, "referred" should read -- referred to --; and
Line 66, "1$" should read -- 1% --.

Column 13,
Line 21, "plate," should read -- plate --.

Column 14,
Line 13, "require" should read -- requires --.

Column 15,
Line 49, "as" should read -- at --.

Column 16,
Line 60, "convex-concave" should read -- concave-convex --.

UNITED STATES PATENT AND TRADEMARK OFFICE
CERTIFICATE OF CORRECTION

PATENT NO. : 6,291,761 B1
DATED : September 18, 2001
INVENTOR(S) : Takeshi Takada et al.

It is certified that error appears in the above-identified patent and that said Letters Patent is hereby corrected as shown below:

<u>Column 23,</u>
Line 27, "resin." should read -- resin film. --.

Signed and Sealed this

Ninth Day of April, 2002

Attest:

JAMES E. ROGAN
*Attesting Officer*    *Director of the United States Patent and Trademark Office*